United States Patent
Kim et al.

(10) Patent No.: US 11,812,175 B2
(45) Date of Patent: Nov. 7, 2023

(54) IMAGE SENSOR AND METHOD OF OPERATING THE SAME

(71) Applicant: SAMSUNG ELECTRONICS CO., LTD., Suwon-si (KR)

(72) Inventors: Munhwan Kim, Seoul (KR); Youngsun Oh, Hwaseong-si (KR); Jongyoon Shin, Suwon-si (KR); Honghyun Jeon, Suwon-si (KR); Hana Choi, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 87 days.

(21) Appl. No.: 17/673,390

(22) Filed: Feb. 16, 2022

(65) Prior Publication Data

US 2022/0360731 A1  Nov. 10, 2022

(30) Foreign Application Priority Data

May 7, 2021  (KR) .................. 10-2021-0059025

(51) Int. Cl.
*H04N 25/766* (2023.01)
*H01L 27/146* (2006.01)
(Continued)

(52) U.S. Cl.
CPC ....... *H04N 25/766* (2023.01); *H01L 27/1463* (2013.01); *H01L 27/14614* (2013.01);
(Continued)

(58) Field of Classification Search
CPC ...... H04N 25/766; H04N 25/11; H04N 25/75; H04N 25/778; H04N 25/79; H04N 25/59;
(Continued)

(56) References Cited

U.S. PATENT DOCUMENTS 7,846,758 B2  12/2010  Ohkawa
10,229,945 B2  3/2019  Soda et al.
(Continued)

FOREIGN PATENT DOCUMENTS

KR  10-2006-0077076 A  7/2006
KR  10-2006-0110147 A  10/2006
(Continued)

*Primary Examiner* — Lin Ye
*Assistant Examiner* — Tuan H Le
(74) *Attorney, Agent, or Firm* — Sughrue Mion, PLLC

(57) ABSTRACT

An image sensor and a method of operating the same are provided. The image sensor includes a semiconductor substrate of a first conductivity type; a photoelectric conversion region provided in the semiconductor substrate and doped to have a second conductivity type; a first floating diffusion region provided to receive photocharges accumulated in the photoelectric conversion region; a transfer gate electrode disposed between and connected to the first floating diffusion region and the photoelectric conversion region; a dual conversion gain transistor disposed between and connected to the first floating diffusion region and a second floating diffusion region; and a reset transistor disposed between and connected to the second floating diffusion region and a pixel power voltage region, wherein a channel region of the reset transistor has a potential gradient increasing in a direction from the second floating diffusion region toward the pixel power voltage region.

20 Claims, 22 Drawing Sheets

(51) Int. Cl.
*H04N 25/11* (2023.01)
*H04N 25/75* (2023.01)
*H04N 25/79* (2023.01)
*H04N 25/778* (2023.01)

(52) U.S. Cl.
CPC .. *H01L 27/14621* (2013.01); *H01L 27/14627* (2013.01); *H01L 27/14645* (2013.01); *H04N 25/11* (2023.01); *H04N 25/75* (2023.01); *H04N 25/778* (2023.01); *H04N 25/79* (2023.01)

(58) Field of Classification Search
CPC ............................ H04N 25/771; H04N 25/65; H01L 27/14614; H01L 27/14621; H01L 27/14627; H01L 27/1463; H01L 27/14645; H01L 27/14603; H01L 27/14616
See application file for complete search history.

(56) References Cited

U.S. PATENT DOCUMENTS

| | | | | |
|---|---|---|---|---|
| 10,397,500 | B1* | 8/2019 | Xu | H04N 25/585 |
| 10,488,482 | B2 | 11/2019 | Rearick et al. | |
| 10,510,796 | B1* | 12/2019 | Wang | H04N 25/778 |
| 11,343,450 | B1* | 5/2022 | Hasegawa | H04N 25/59 |
| 11,343,459 | B2* | 5/2022 | Jung | H04N 25/79 |
| 11,418,734 | B1* | 8/2022 | Wang | H04N 25/709 |
| 2007/0035649 | A1* | 2/2007 | McKee | H04N 25/59 |
| | | | | 348/E3.018 |
| 2019/0222780 | A1* | 7/2019 | Chang | H04N 25/57 |
| 2021/0360175 | A1* | 11/2021 | Dai | H04N 25/13 |
| 2022/0321822 | A1* | 10/2022 | Yang | H01L 27/14641 |

FOREIGN PATENT DOCUMENTS

| | | |
|---|---|---|
| KR | 10-0789575 B1 | 12/2007 |
| KR | 10-0790214 B1 | 1/2008 |

* cited by examiner

IMAGE SENSOR AND METHOD OF OPERATING THE SAME

CROSS-REFERENCE TO RELATED APPLICATION

This U.S. non-provisional patent application claims priority under 35 U.S.C. § 119 to Korean Patent Application No. 10-2021-0059025, filed on May 7, 2021, in the Korean Intellectual Property Office, the disclosures of which are incorporated by reference herein in its entirety.

BACKGROUND

The present disclosure relates to an image sensor and a method of operating the same, and in particular, to a highly-integrated image sensor with improved optical and electric characteristics and a method of operating the same.

An image sensor is a device that converts optical signals into electrical signals. With the development of the computer and communications industries, there is an increasing demand for high performance image sensors in a variety of applications such as digital cameras, camcorders, personal communication systems, gaming machines, security cameras, micro-cameras for medical applications, and/or robots.

The image sensors are generally classified into charge coupled device (CCD) and complementary metal-oxide semiconductor (CMOS) image sensors. For the CMOS image sensor, it is possible to reduce a size of a device including the CMOS image sensor, because the CMOS image sensor can be operated by a simple operation method and signal-processing circuits of the CMOS image sensor can be integrated on a single chip. In addition, since the CMOS image sensor has a relatively low power consumption, it may be preferable to use the CMOS image sensor in an electronic device with a limited battery capacity. Furthermore, the CMOS image sensor can be fabricated using CMOS fabrication techniques, and thus, it is possible to reduce a manufacturing cost thereof. Moreover, the use of CMOS image sensors is rapidly increasing, as the high-resolution CMOS image sensor is realized.

SUMMARY

One or more embodiments of the inventive concept provide a highly-integrated image sensor with improved optical and electric characteristics and a method of operating the same.

According to an embodiment, there is provided a method of operating an image sensor. The method includes: performing a first reset operation to reset a floating diffusion region; sampling a first electric potential of the floating diffusion region having a first conversion gain in a reset state, to obtain a first reset signal during a first output interval; sampling a second electric potential of a photoelectric conversion region having the first conversion gain to obtain a first pixel signal during a second output interval; adjusting the first conversion gain of the floating diffusion region to a second conversion gain based on the first reset signal and the first pixel signal; sampling a third electric potential of the floating diffusion region having the second conversion gain to obtain a second pixel signal during a third output interval; performing a second reset operation to reset the floating diffusion region; and sampling a fourth electric potential of the floating diffusion region having the second conversion gain in the reset state, to obtain a second reset signal during a fourth output interval.

According to an embodiment, there is provided a method of operating an image sensor including a dual conversion gain transistor provided between and connected to a first charge detection node and a second charge detection node, and a reset transistor provided between and connected to the second charge detection node and a pixel power voltage. The method includes: performing a first reset operation to reset the first charge detection node and the second charge detection node; turning off the dual conversion gain transistor and reading out a first reset signal from the first charge detection node; transferring an electric charge accumulated in a photoelectric conversion device, to the first charge detection node and reading out a first pixel signal from the first charge detection node; turning on the dual conversion gain transistor and reading out a second pixel signal from the first charge detection node; performing a second reset operation to reset the first charge detection node and the second charge detection node; and reading out a second reset signal from the first charge detection node.

According to an embodiment, there is provided an image sensor, including: a semiconductor substrate of a first conductivity type; a photoelectric conversion region provided in the semiconductor substrate and doped to have a second conductivity type; a first floating diffusion region provided to receive photocharges accumulated in the photoelectric conversion region; a transfer gate electrode disposed between and connected to the first floating diffusion region and the photoelectric conversion region; a dual conversion gain transistor disposed between and connected to the first floating diffusion region and a second floating diffusion region; and a reset transistor disposed between and connected to the second floating diffusion region and a pixel power voltage region, wherein a channel region of the reset transistor has a potential gradient increasing in a direction from the second floating diffusion region toward the pixel power voltage region.

According to an embodiment, there is provided an image sensor, including: a semiconductor substrate of a first conductivity type; a photoelectric conversion region provided in the semiconductor substrate and doped to have a second conductivity type; a first floating diffusion region provided in the semiconductor substrate and spaced apart from the photoelectric conversion region; a transfer gate electrode provided between the photoelectric conversion region and the first floating diffusion region; a dual conversion gain gate electrode provided between the first floating diffusion region and a second floating diffusion region; a reset gate electrode provided between the second floating diffusion region and a pixel power voltage region; a first gate insulating layer between the reset gate electrode and the semiconductor substrate; and a second gate insulating layer between the dual conversion gain gate electrode and the semiconductor substrate, wherein the first gate insulating layer includes a first portion adjacent to the pixel power voltage region and a second portion adjacent to the second floating diffusion region, the first portion has a first thickness, the second portion has a second thickness that is larger than the first thickness, and the second gate insulating layer has a third thickness that is substantially equal to the second thickness of the second portion of the first gate insulating layer.

According to an embodiment, there is provided an image sensor, including: a semiconductor substrate of a first conductivity type; a pixel isolation structure provided in the semiconductor substrate to form a first pixel region and a second pixel region; a photoelectric conversion region provided in each of the first pixel region and a second pixel region in the semiconductor substrate, and is doped to have a second conductivity type; a floating diffusion region provided in each of the first pixel region and the second pixel region in the semiconductor substrate, and is spaced apart from the photoelectric conversion region; a transfer gate electrode provided between the photoelectric conversion region and the floating diffusion region, and provided in each of the first pixel region and the second pixel region; a reset gate electrode disposed on the semiconductor substrate in the first pixel region; a first source region provided in the semiconductor substrate in the first pixel region and at a side of the reset gate electrode; a first drain region provided in the semiconductor substrate in the first pixel region and at an opposite side of the reset gate electrode; a first gate insulating layer provided between the reset gate electrode and the semiconductor substrate; a dual conversion gain gate electrode disposed on the semiconductor substrate of the second pixel region; a second source region provided in the semiconductor substrate in the second pixel region and at a side of the dual conversion gain gate electrode; a second drain region provided in the semiconductor substrate in the second pixel region and at an opposite side of the dual conversion gain gate electrode; and a second gate insulating layer provided between the dual conversion gain gate electrode and the semiconductor substrate, wherein the first gate insulating layer includes a first portion adjacent to the first source region and a second portion adjacent to the first drain region, the first portion has a first thickness, and the second portion has a second thickness that is larger than the first thickness.

DETAILED DESCRIPTION

Example embodiments of the inventive concepts will now be described in more detail with reference to the accompanying drawings, in which example embodiments are shown.

Figure 1:
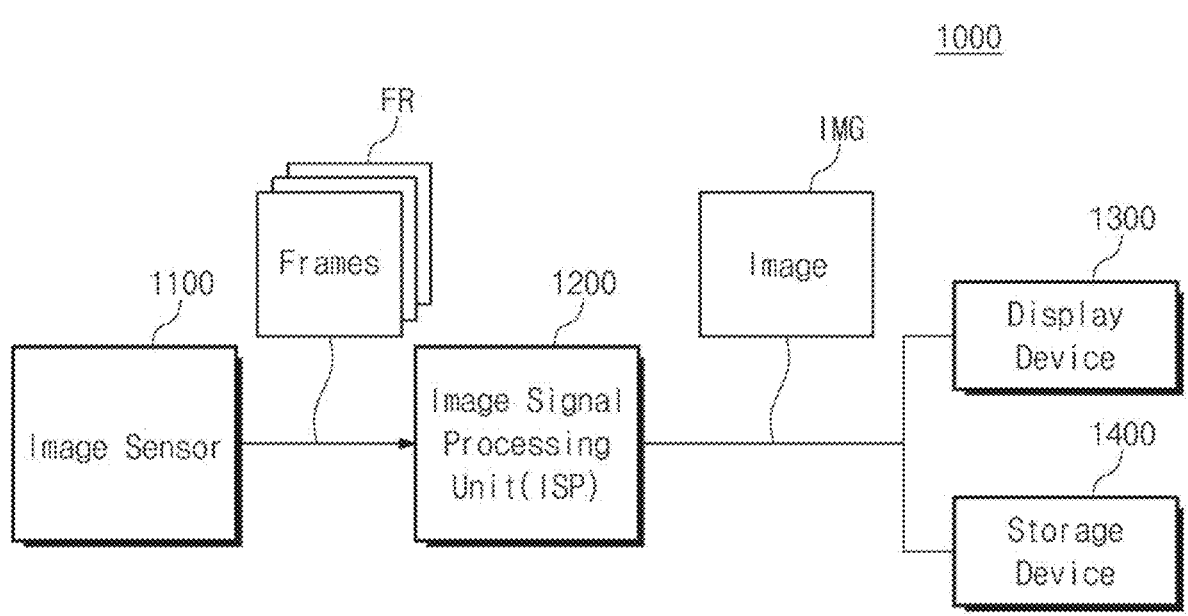
FIG. 1 is a block diagram illustrating an image processing device according to an embodiment.

FIG. 1 is a block diagram illustrating an image processing device according to an embodiment.

Referring to FIG. 1, an image processing device 1000 may include an image sensor 1100, an image signal processing unit (ISP) 1200, a display device 1300, and a storage device 1400.

The image processing device 1000 may be electronic devices (e.g., smart phones and digital cameras) which are configured to obtain an image of an external object.

The image sensor 1100 may convert an optical image of the external object to electric signals or data signals. The image sensor 1100 may include a plurality of pixels. Each of the pixels may be configured to receive light, which is reflected from the external object, and to convert the received light to an electric image signal or a picture signal.

The image signal processing unit 1200 may be configured to perform a signal processing operation on frame data FR (e.g., the image data or the picture data), which is received from the image sensor 1100, and output image data IMG, which may be partially corrected. For example, the image signal processing unit 1200 may perform a signal process operation (e.g., color interpolation, color correction, gamma correction, color space conversion, and edge correction operations) on the received frame data FR, and the image data IMG may be produced as a result of the signal process operation.

The display device 1300 may output the image data IMG, which is provided by the image signal processing unit 1200, to a user. For example, the display device 1300 may include various display panels (e.g., a liquid crystal display (LCD) panel, an organic light emitting display (OLED) panel, an electrophoretic display panel, or an electrowetting display panel). The display device 1300 may output the image data IMG through the display panel.

The storage device 1400 may be configured to store the image data IMG provided from the image signal processing unit 1200. The storage device 1400 may include a volatile memory device (e.g., static random access memory (SRAM), dynamic random access memory (DRAM), and synchronous DRAM (SDRAM)) or a non-volatile memory device (e.g., read only memory (ROM), programmable ROM (PROM), electrically programmable ROM (EPROM), electrically erasable and programmable ROM (EEPROM), FLASH memory device, phase-change RAM (PRAM), magnetic RAM (MRAM), resistive RAM (RRAM), and ferroelectric RAM (FRAM) devices).

Figure 2:
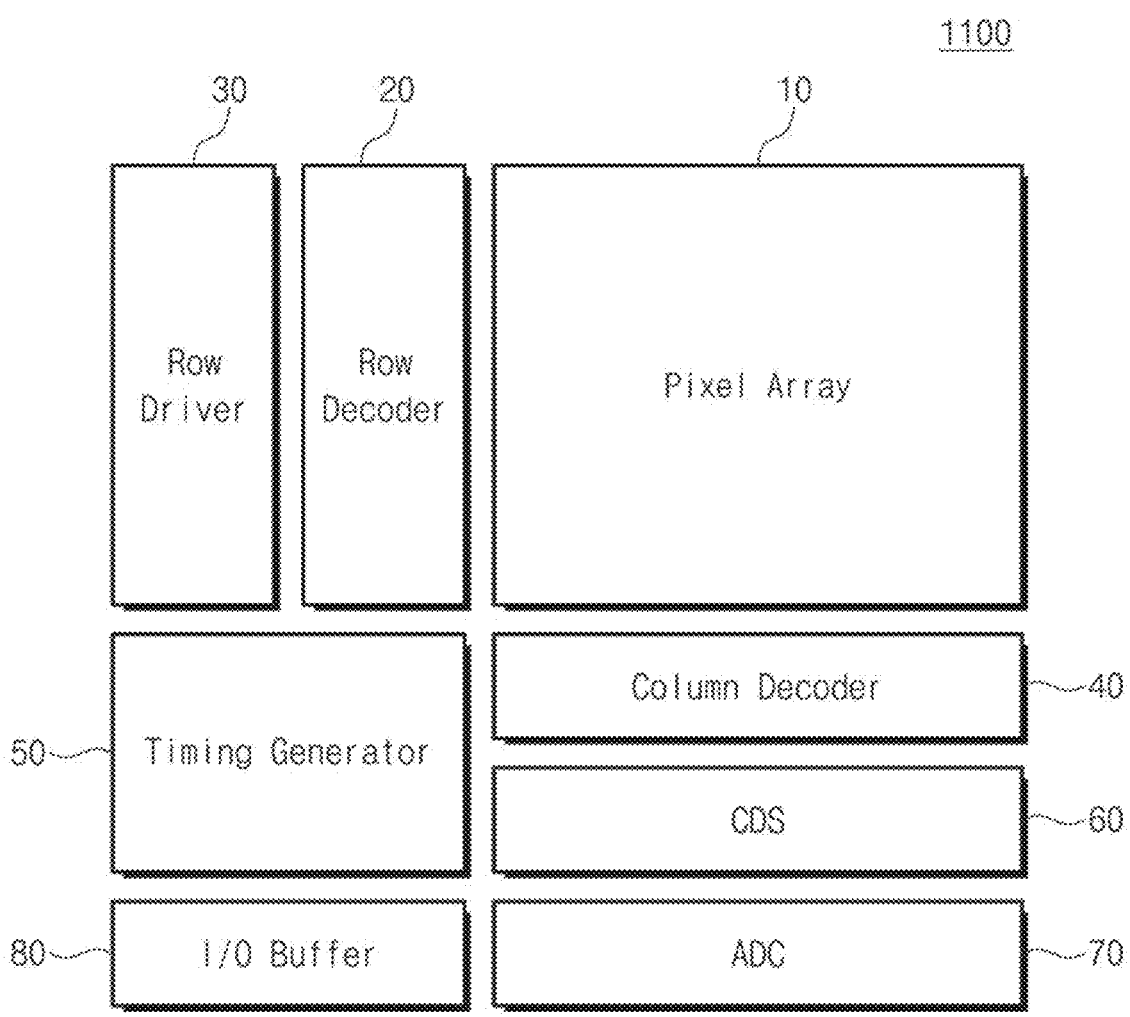
FIG. 2 is a block diagram illustrating an image sensor according to an embodiment.

FIG. 2 is a block diagram illustrating an image sensor according to an embodiment.

Referring to FIG. 2, the image sensor 1100 may include a pixel array 10, a row decoder 20, a row driver 30, a column decoder 40, a timing generator 50, a correlated dual sampler (CDS) 60, an analog-to-digital converter (ADC) 70, and an input/output (I/O) buffer 80.

The pixel array 10 may include a plurality of unit pixels, which are arranged to form a plurality of rows and a plurality of columns, and the unit pixels may convert an incident light to an electrical signal. The pixel array 10 may be driven by a plurality of driving signals, such as selection signals, reset signals, and transfer signals, which are provided from the row decoder 20.

The row decoder 20 may be configured to provide driving signals to respective rows of the unit pixels. In addition, the electrical signal from the conversion in the pixel array 10 may be provided to the correlated dual sampler 60, in response to the driving signals.

The row driver 30 may provide a plurality of driving signals, which are used to drive the unit pixels, to the pixel array 10 in accordance with the decoded result obtained from the row decoder 20. In the case where the unit pixels are arranged in a matrix shape, the driving signals may be applied to the rows of the unit pixels, respectively.

The timing generator 50 may generate control signals (e.g., clock signals and timing control signals), which are used to control operations of the row decoder 20 and the column decoder 40, the correlated dual sampler 60, the analog-to-digital converter 70, and the input/output buffer 80. The timing generator 50 may include a logic control circuit, a phase lock loop (PLL) circuit, a timing control circuit, a communication interface circuit, and so forth.

The correlated dual sampler 60 may receive electric signals, which are generated in the pixel array 10, and may perform operations of holding and sampling the received electric signals. For example, the correlated dual sampler 60 may perform a dual sampling operation on a specific noise level and a signal level of the electric signal and then may output a difference level corresponding to a difference between the noise and signal levels.

The analog-to-digital converter 70 may be configured to convert an analog signal, which includes information on the difference level outputted from the correlated dual sampler 60, to a digital signal and output the digital signal.

The input/output buffer 80 may latch the digital signal, which are output from the analog-to-digital converter 70, and sequentially output the latched digital signals to an image signal processing unit in accordance with the decoding result obtained from the column decoder 40.

Figure 3A:
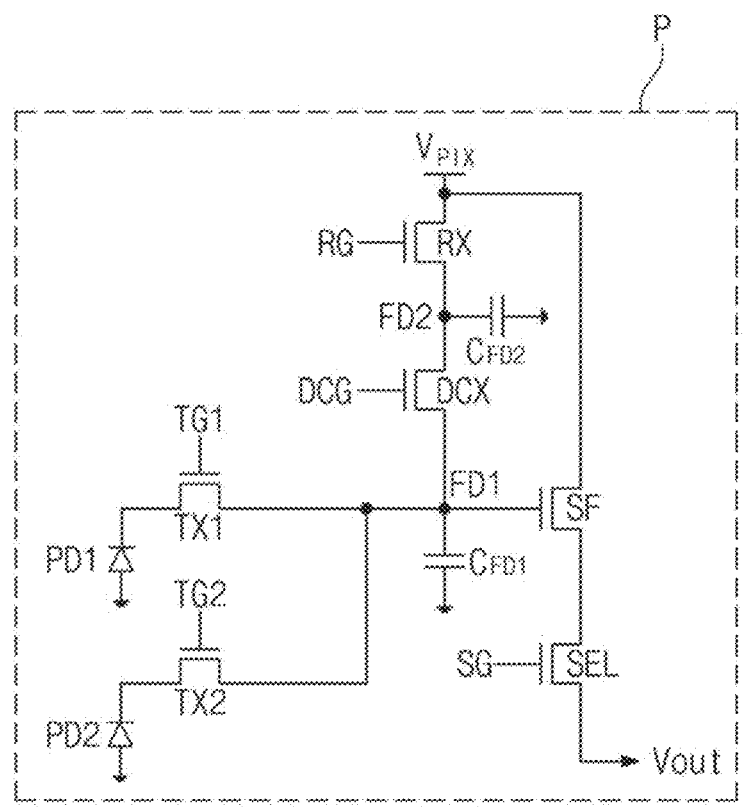
FIGS. 3A, 3B, and 3C are circuit diagrams illustrating a unit pixel of a pixel array according to an embodiment.
Figure 3B:
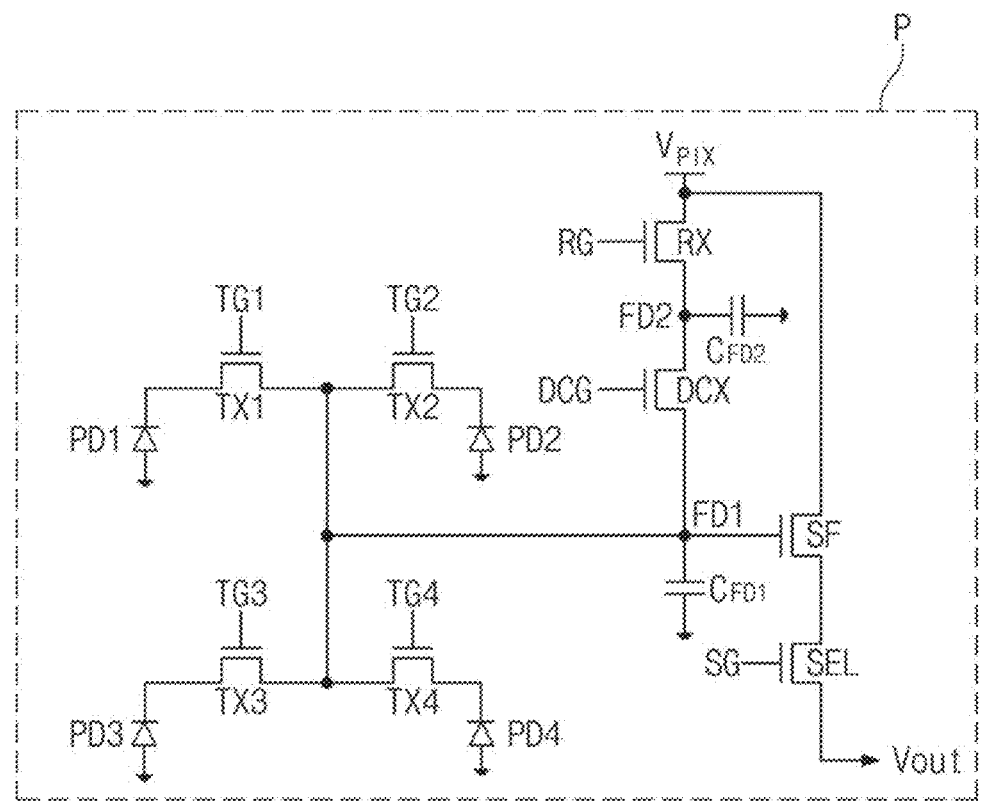
Figure 3C:
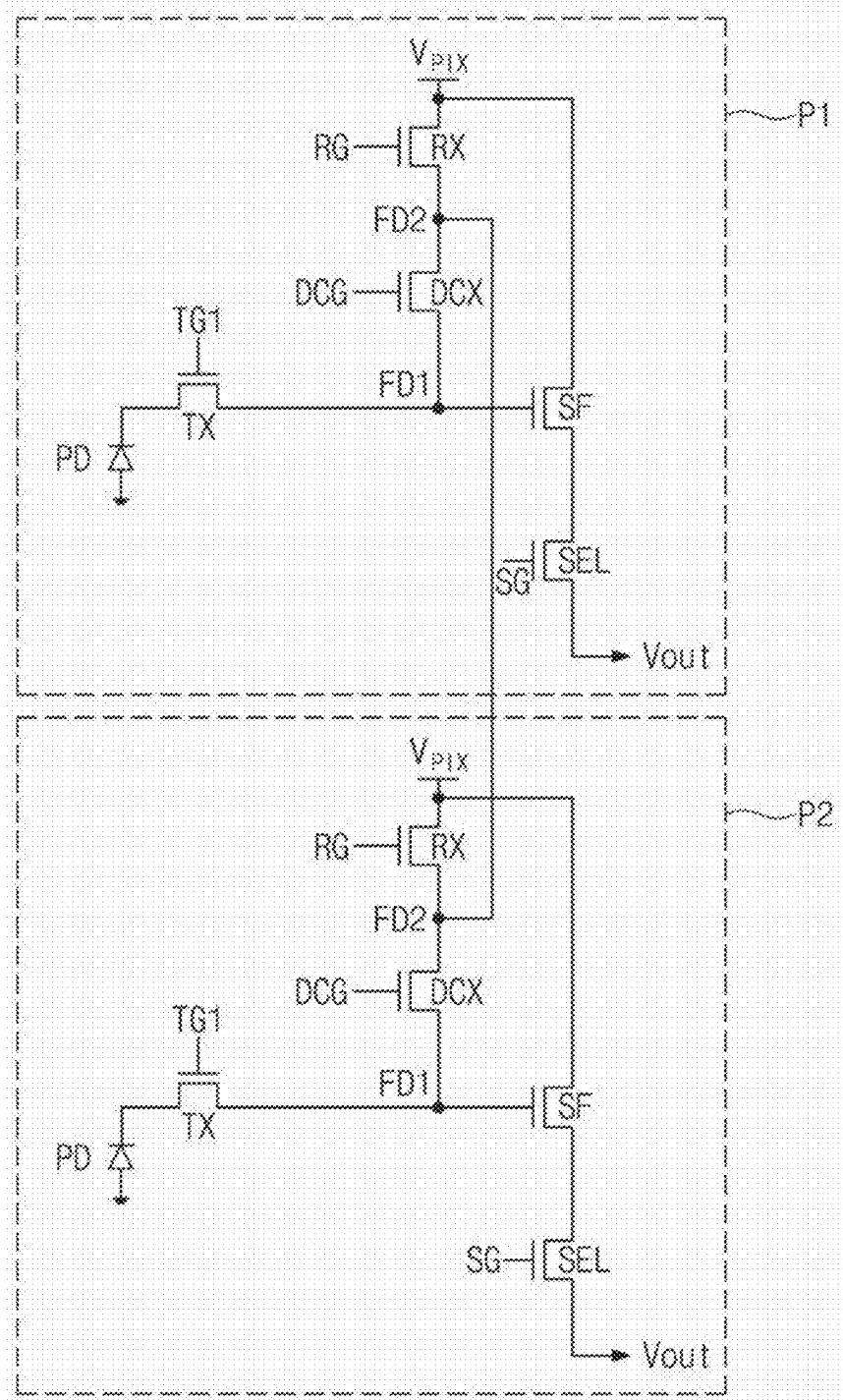

FIGS. 3A, 3B, and 3C are circuit diagrams illustrating a unit pixel of a pixel array according to an embodiment.

Referring to FIG. 3A, a unit pixel P may include a first photoelectric conversion device PD1, a second photoelectric conversion device PD2, a first transfer transistor TX1, a second transfer transistor TX2, and four pixel transistors.

Here, the pixel transistors may include a reset transistor RX, a source follower transistor SF, a selection transistor SEL, and a dual conversion gain transistor DCX. FIG. 3A illustrates an example in which each of the unit pixels P includes four pixel transistors, but the inventive concept is not limited to this example. That is, the number of the pixel transistors in each of the unit pixels P may be variously changed.

The first and second photoelectric conversion devices PD1 and PD2 may produce and accumulate electric charges, and in this case, an amount of the electric charges may be determined by an intensity of the incident light. In an embodiment, each of the first and second photoelectric conversion devices PD1 and PD2 may be one of a photo diode, a photo transistor, a photo gate, a pinned photo diode (PPD), and combinations thereof.

The first and second transfer transistors TX1 and TX2 may be configured to transfer the electric charges, which are accumulated in the photoelectric conversion devices PD1 and PD2, to a first charge detection node FD1 (e.g., a first floating diffusion region). The first and second transfer transistors TX1 and TX2 may be controlled by a first transfer signal TG1 and a second transfer signal TG2, respectively.

The first and second transfer transistors TX1 and TX2 may share the first charge detection node FD1.

The first transfer transistor TX1 may be configured to transfer electric charges, which are accumulated in the first photoelectric conversion device PD1, to the first charge detection node FD1 in response to the first transfer signal TG1 being applied to the first transfer gate electrode TG1.

The second transfer transistor TX2 may be configured to transfer electric charges, which are accumulated in the second photoelectric conversion device PD2, to the first charge detection node FD1 in response to the second transfer signal TG2 being applied to the second transfer gate electrode TG2.

The first charge detection node FD1 may receive and cumulatively store the electric charges, which are generated in the photoelectric conversion device PD. The source follower transistor SF may be controlled by an amount of photocharges accumulated in the first charge detection node FD1.

The reset transistor RX may be configured to periodically drain electric charges, which are accumulated in the first charge detection node FD1 and a second charge detection node FD2, based on a reset signal applied to a reset gate electrode RG. For example, a drain terminal of the reset transistor RX may be connected to a dual conversion gain transistor DCX, and a source terminal of the reset transistor RX may be connected to a pixel power voltage $V_{PIX}$. When the reset transistor RX and the dual conversion gain transistor DCX are turned on, the pixel power voltage $V_{PIX}$ may be transmitted to the first and second charge detection nodes FD1 and FD2. Accordingly, the electric charges, which are accumulated in the first and second charge detection nodes FD1 and FD2, may be discharged, and thus, the first and second charge detection nodes FD1 and FD2 may be reset.

The dual conversion gain transistor DCX may be provided between the first charge detection node FD1 and the second charge detection node FD2. The dual conversion gain transistor DCX may be connected to the first charge detection node FD1 and the second charge detection node FD2. The dual conversion gain transistor DCX may be connected in series to the reset transistor RX through the second charge detection node FD2. In other words, the dual conversion gain transistor DCX may be provided between the first charge detection node FD1 and the reset transistor RX. That is, the dual conversion gain transistor DCX may be connected to the first charge detection node FD1 and the reset transistor RX. The dual conversion gain transistor DCX may change a capacitance of a first capacitor $C_{FD1}$ connected to the first charge detection node FD1 in response to a dual conversion gain control signal. As such, a conversion gain of the unit pixel P may be changed according to the dual conversion gain control signal from the dual conversion gain transistor DCX.

Moreover, during an imaging process, not only a high intensity of light but also a low intensity of light may be incident on the pixel array. Accordingly, a conversion gain in each pixel may vary depending on incident light. When the dual conversion gain transistor DCX is turned off, the unit pixel may have a first conversion gain, and when the dual conversion gain transistor DCX is turned on, the unit pixel may have a second conversion gain that is greater than the first conversion gain. Depending on an operation of the dual conversion gain transistor DCX, the conversion gain in a first conversion gain mode (or a high intensity mode) or a second conversion gain mode (or a low intensity mode) may be applied.

When the dual conversion gain transistor DCX is turned off, the first charge detection node FD1 may have a capacitance corresponding to the first capacitance of a first capacitor $C_{FD1}$. When the dual conversion gain transistor DCX is turned on, the first charge detection node FD1 may be connected to the second charge detection node FD2, and a capacitance in the first and second charge detection nodes FD1 and FD2 may be equal to a sum of the first and second capacitance of the first and second capacitors $C_{FD1}$ and $C_{FD2}$. In other words, when the dual conversion gain transistor DCX is turned on, the capacitance of the first or second charge detection node FD1 or FD2 may be increased, and this may lead to a reduction in the overall conversion gain. Also, when the dual conversion gain transistor DCX is turned off, the capacitance of the first charge detection node FD1 may be decreased and the overall conversion gain may be increased.

The source follower transistor SF may be a source follower buffer amplifier, which provides a source-drain current in proportion to a charge amount of the first charge detection node FD1, which is input to a source follower gate electrode. The source follower transistor SF may amplify a change in electric potential of the charge detection node and may output a signal, which is amplified through the selection transistor SX, to an output line Vout. A source terminal of the source follower transistor SF may be connected to the pixel power voltage $V_{PIX}$, and a drain terminal of the source follower transistor SF may be connected to a source terminal of the selection transistor SX.

The selection transistor SX may be used to select a row of the unit pixels P to be read out during a read operation. When the selection transistor SX is turned on by a selection signal SG applied to a selection gate electrode, an electrical signal may be output to the output line Vout from a drain electrode of the source follower transistor SF.

Referring to FIG. 3B, the unit pixel P may include a first photoelectric conversion device PD, a second photoelectric conversion device PD2, a third photoelectric conversion device PD3, a fourth photoelectric conversion device PD4 (hereinafter "the first to fourth" photoelectric conversion devices PD1 to PD4). The unit pixel P may also include a first transfer transistor TX1, a second transfer transistor TX2, a third transfer transistor TX3, a fourth transfer transistor TX4 (hereinafter "the first to fourth" transfer transistors TX1 to TX4), and four pixel transistors RX, DCX, SF, and SEL.

The first to fourth transfer transistors TX1 to TX4 may share a charge detection node FD. Transfer gate electrodes of the first to fourth transfer transistors TX1 to TX4 may be controlled respectively by a first transfer signal TG1, a second transfer signal TG2, a third transfer signal TG3 and a fourth transfer signal TG4 (hereinafter "the first to fourth" transfer signals TG1 to TG4).

Referring to FIG. 3C, the pixel array may include a first pixel P1 and a second pixel P2, and each of the first and second pixels P1 and P2 may include a photoelectric conversion device PD, a transfer transistor TX, a reset transistor RX, a dual conversion gain transistor DCX, a source follower transistor SF, and a selection transistor SX.

In each of the first and second pixels P1 and P2, the dual conversion gain transistor DCX may be provided between and connected to the first charge detection node FD1 and the second charge detection node FD2, as described above with reference to FIG. 3A. The second charge detection nodes FD2 of the first and second pixels P1 and P2 may be connected to each other.

Figure 4:
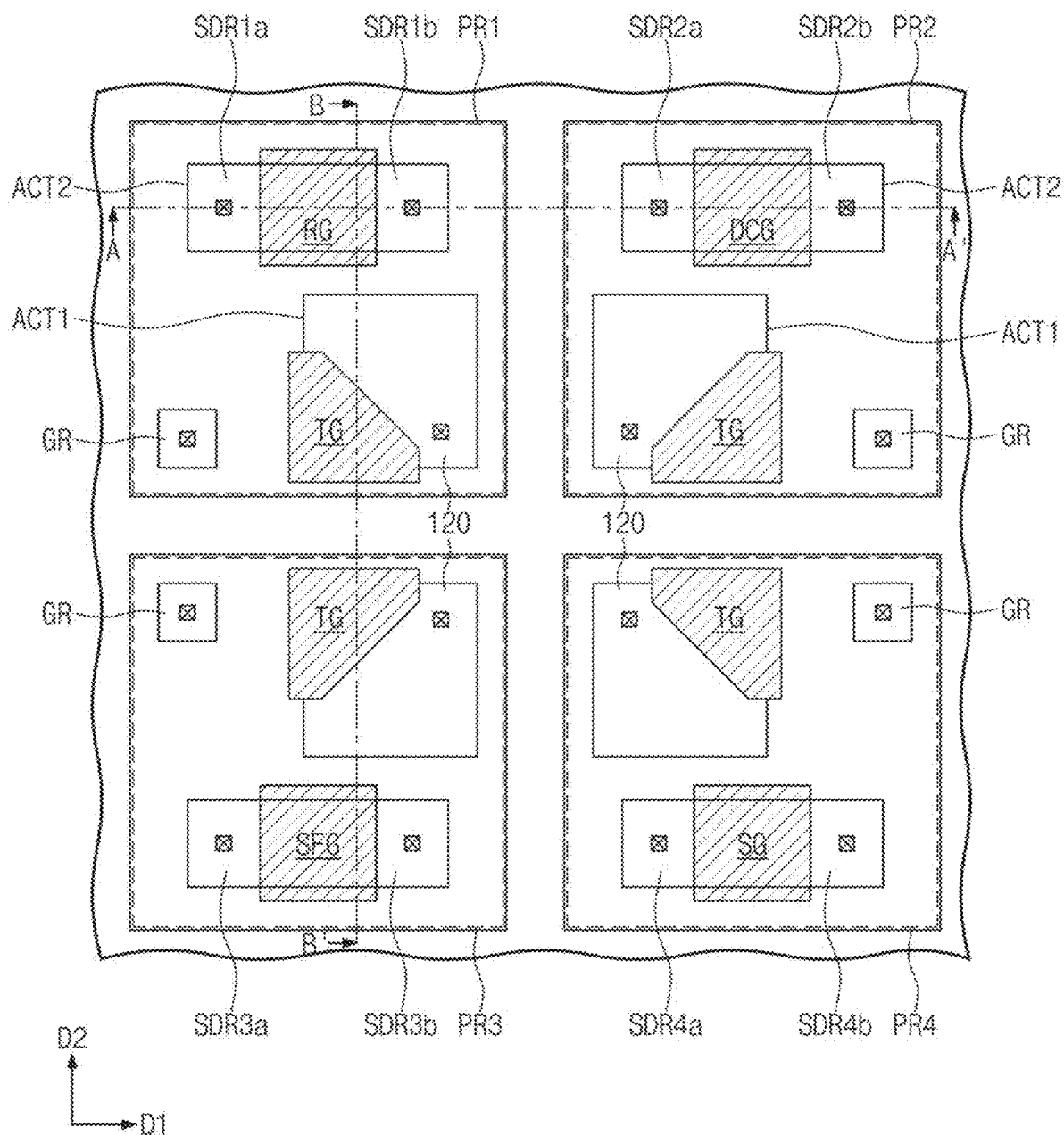
FIG. 4 is a plan view illustrating a unit pixel of an image sensor according to an embodiment.
Figure 5A:
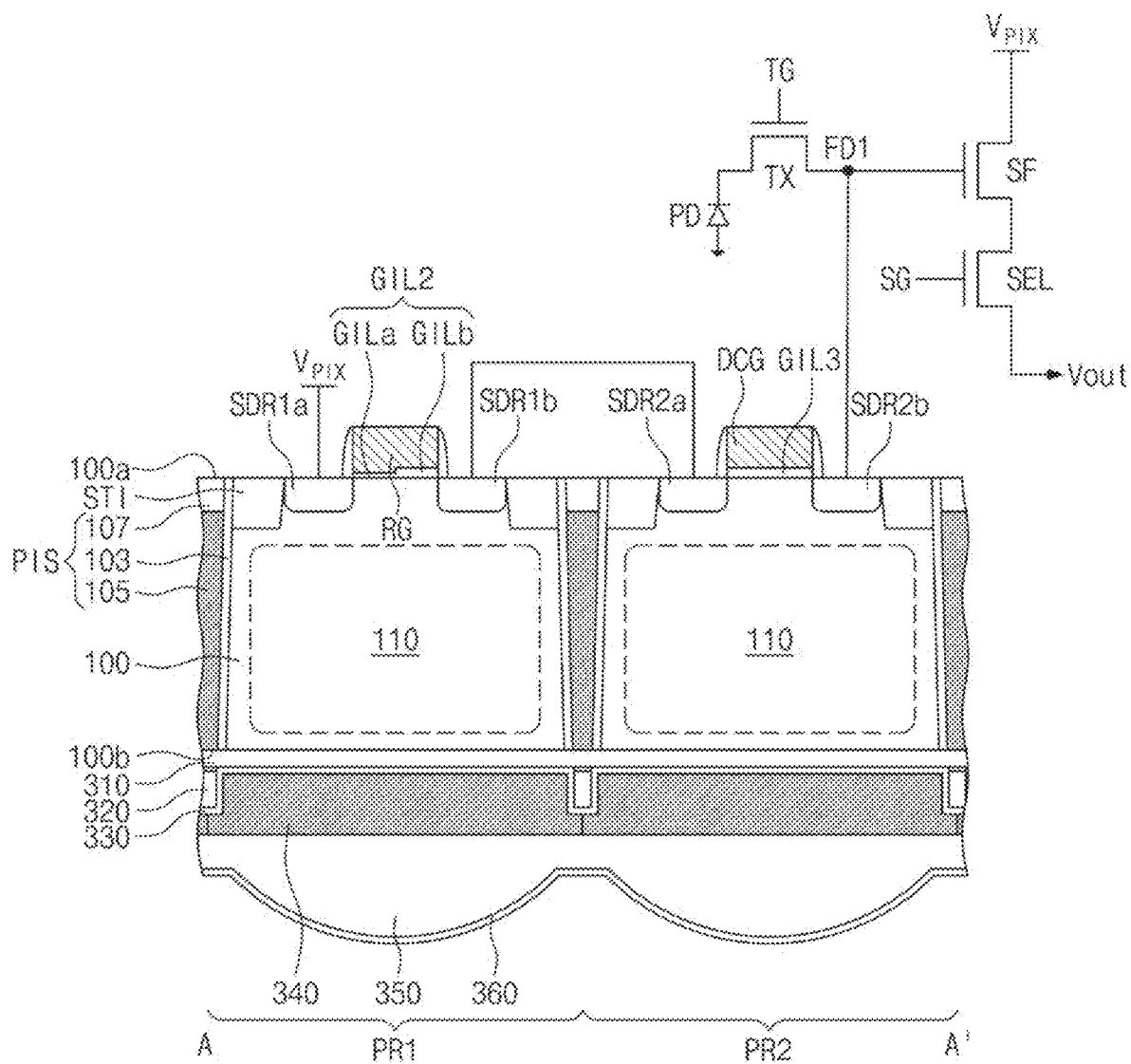
FIGS. 5A and 5B are sectional views, which are respectively taken along lines A-A' and B-B' of FIG. 4 to illustrate an image sensor according to an embodiment.
Figure 5B:
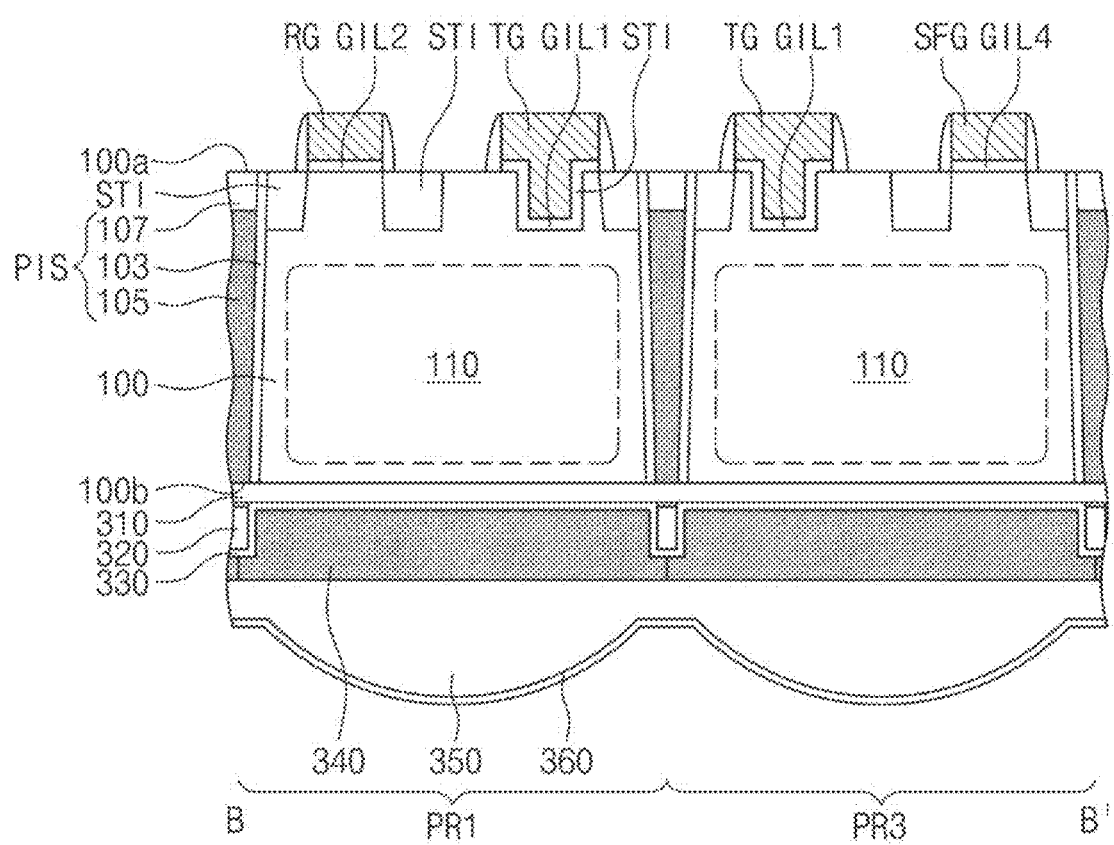

FIG. 4 is a plan view illustrating a unit pixel of an image sensor according to an embodiment. FIGS. 5A and 5B are sectional views, which are respectively taken along lines A-A' and B-B' of FIG. 4 to illustrate an image sensor according to an embodiment.

Referring to FIGS. 4, 5A, and 5B, a semiconductor substrate 100 may have a front surface 100a (or a first surface) and a rear surface 100b (or a second surface), which are opposite to each other. The semiconductor substrate 100 may be a part of a structure including a first conductivity type (e.g., p-type) bulk silicon substrate and a first conductivity type epitaxial layer thereon. For example, the bulk silicon substrate may be removed during a process of fabricating an image sensor, and the semiconductor substrate 100 may be the p-type epitaxial layer, which is left as a result of the removal of the bulk silicon substrate. Alternatively or additionally, the semiconductor substrate 100 may be a bulk semiconductor substrate, in which a well region of the first conductivity type is formed.

A pixel isolation structure PIS may be disposed adjacent to the semiconductor substrate 100 to define a first pixel region PR1 to a fourth pixel region PR4.

The pixel isolation structure PIS may include first portions extending in a first direction D1 parallel to each other, and second portions extending in a second direction D2 parallel to each other and intersecting the first portions. The pixel isolation structure PIS may enclose each of the first to fourth pixel regions PR1 to PR4.

The pixel isolation structure PIS may extend from the first surface 100a to the second surface 100b. The pixel isolation structure PIS may have an upper width near the first surface 100a of the semiconductor substrate 100 and may have a lower width near its bottom surface. The lower width may be substantially equal to or smaller than the upper width. The width of the pixel isolation structure PIS may gradually decrease in a direction from the first surface 100a of the semiconductor substrate 100 to the second surface 100b.

The pixel isolation structure PIS may include a liner insulating pattern 103, a semiconductor pattern 105, and a capping insulating pattern 107. The semiconductor pattern 105 may be provided to vertically penetrate a portion of the semiconductor substrate 100, and the liner insulating pattern 103 may be provided between the semiconductor pattern 105 and the semiconductor substrate 100. The capping insulating pattern 107 may be disposed on the semiconductor pattern 105 and may have a top surface located at substantially the same level as a top surface of a device isolation layer STI. The liner insulating pattern 103 and the capping insulating pattern 107 may be formed of or include at least one of silicon oxide, silicon oxynitride, or silicon nitride. The semiconductor pattern 105 may include a doped poly-silicon layer or a doped poly-silicon layer. The semiconductor pattern 105 may include an air gap or a void.

In each of the first to fourth pixel regions PR1 to PR4, photoelectric conversion regions 110 may be provided in the semiconductor substrate 100. The photoelectric conversion regions 110 may generate photocharges in proportional to an intensity of the incident light. The photoelectric conversion regions 110 may be formed by injecting impurities having a second conductivity type that is different from the first conductivity type of the semiconductor substrate 100, into the semiconductor substrate 100. The semiconductor substrate 100 and the photoelectric conversion region 110 may have different conductivity types from each other and may form a photo diode or a p-n junction.

In each of the first to fourth pixel regions PR1 to PR4, the device isolation layer STI may include a first active portion ACT1 and a second active portion ACT2 in the first surface 100a of the semiconductor substrate 100. In each of the first and second pixel regions PR1 and PR2, the first and second active portions ACT1 and ACT2 may be spaced apart from each other and may have different sizes from each other.

In each of the first to fourth pixel regions PR1 to PR4, the first active portion ACT1 may have one of various polygonal shapes. For example, in each of the first to fourth pixel regions PR1 to PR4, the second active portion ACT2 may be a bar-shaped pattern having a long axis parallel to the first direction D1 and having a constant width.

In each of the first to fourth pixel regions PR1 to PR4, a ground impurity region GR may be provided in the semiconductor substrate 100. The ground impurity region GR may be spaced apart from the first and second active portions ACT1 and ACT2 by the device isolation layer STI. The ground impurity region GR may be doped to have the same conductivity type as the semiconductor substrate 100.

A transfer gate electrode TG may be disposed on the first active portion ACT1 of each of the first to fourth pixel regions PR1 to PR4. Each transfer gate electrode TG may include a lower portion that is inserted into the semiconductor substrate 100, and an upper portion that is connected to the lower portion and protrudes above the first surface 100a of the semiconductor substrate 100. The lower portion of each transfer gate electrode TG may be provided to vertically penetrate a portion of the semiconductor substrate 100. A bottom surface of each transfer gate electrode TG may be located at a level that is lower than the first surface 100a of the semiconductor substrate 100. A first gate insulating layer GIL1 may be interposed between each transfer gate electrode TG and the semiconductor substrate 100.

A first floating diffusion region 120 may be provided in the first active portion ACT1 adjacent to each transfer gate electrode TG. The first floating diffusion region 120 may be an impurity region having a different conductivity type from the first conductivity type of the semiconductor substrate 100.

In each of the first to fourth pixel regions PR1 to PR4, a pixel gate electrode may be disposed on the second active portion ACT2. The pixel gate electrode may be one of the reset, dual conversion gain, source follower, and selection transistors RX, SF, DCX, and SEL described with reference to FIG. 3A. Pixel gate electrodes RG, DCG, SFG, and SG may be included in the respective first to fourth pixel regions PR1 to PR4 and may be different transistors from each other.

As an example, the pixel regions may include the first to fourth pixel regions PR1 to PR4. The first pixel region PR1 may include a gate electrode RG of the reset transistor RX. The second pixel region PR2 may include a gate electrode DCG of the dual conversion gain transistor DCX. The third pixel region PR3 may include a gate electrode SFG of the source follower transistor SF. The fourth pixel region PR4 may include a gate electrode SG of the selection transistor SEL.

As an example, the reset gate electrode RG may be disposed on the second active portion ACT2 of the first pixel region PR1, and the dual conversion gain gate electrode DCG may be disposed on the second active portion ACT2 of the second pixel region PR2. In addition, a source follower gate electrode SFG may be disposed on the second active portion ACT2 of the third pixel region PR3, and a selection gate electrode SG may be disposed on the second active portion ACT2 of the fourth pixel region PR4. In an embodiment, the arrangement of the gate electrodes RG, DCG, SFG, and SG may not be limited to this example and may be variously changed.

A first source region SDR1a and a first drain region SDR1b may be provided in the second active portion ACT2 at both sides of the reset gate electrode RG. A second source region SDR2a and a second drain region SDR2b may be provided in the second active portion ACT2 at both sides of the dual conversion gain gate electrode DCG. A third source region SDR3a and a third drain region SDR3b may be provided in the second active portion ACT2 at both sides of the source follower gate electrode SFG. A fourth source region SDR4a and a fourth drain region SDR4b may be provided in the second active portion ACT2 at both sides of the selection gate electrode SG. The first to fourth source regions SDR1a to SDR4a and the first to fourth drain regions SDR1b to SDR4b may be doped to have the second conductivity type, which is different from the first conductivity type of the semiconductor substrate 100. Contact plugs may be respectively coupled to the first to fourth source regions SDR1a to SDR4a and the first to fourth drain regions SDR1b to SDR4b.

The pixel power voltage $V_{PIX}$ may be applied to the first source region SDR1a (e.g., a pixel power voltage region) at a side of the reset gate electrode RG. The first drain region SDR1b at an opposite side of the reset gate electrode RG may be electrically connected to the second source region SDR2a at a side of the dual conversion gain gate electrode DCG through a contact plug and a conductive line. In other words, the first drain region SDR1b and the second source region SDR2a may be electrically connected in common to the second charge detection node FD2.

The second drain region SDR2b at a side of the dual conversion gain gate electrode DCG may be electrically connected to the first floating diffusion regions 120 (e.g., the first charge detection node FD1) of the first to fourth pixel regions PR1 to PR4 through a contact plug and a conductive line and may be electrically connected to the source follower gate electrode SFG.

The pixel power voltage $V_{PIX}$ may be applied to the third source region SDR3a at a side of the source follower gate electrode SFG. The third drain region SDR3b, which is located at an opposite side of the source follower gate electrode SFG, may be electrically connected to the fourth source region SDR4a at a side of the selection gate electrode SG. An output line (not shown) may be connected to the fourth drain region SDR4b at an opposite side of the selection gate electrode SG.

In an embodiment, a second gate insulating layer GIL2 may be disposed between the reset gate electrode RG and the semiconductor substrate 100. The second gate insulating layer GIL2 disposed below the reset gate electrode RG may include a first portion GILa having a first thickness and a second portion GILb having a second thickness that is greater than the first thickness. The first portion GILa of the second gate insulating layer GIL2 may be adjacent to the first source region SDR1a (e.g., the pixel power voltage region), to which the pixel power voltage $V_{PIX}$ is applied, and the second portion GILb may be adjacent to the first drain region SDR1b.

Specifically, the first and second portions GILa and GILb of the second gate insulating layer GIL2 may have bottom surfaces that are substantially coplanar with each other, and a top surface of the first portion GILa may be located at a level that is lower than a top surface of the second portion GILb. In other words, a height of the first portion GILa is less than a height of the second portion GILb. Alternatively, the top surface of the semiconductor substrate 100 below the second portion GILb of the second gate insulating layer GIL2 may be recessed. In this case, the top surfaces of the first and second portions may be substantially coplanar with each other, and the bottom surface of the first portion GILa may be located at a level that is higher than the bottom surface of the second portion GILb.

In an embodiment, an electric potential of a channel region below the first portion GILa of the second gate insulating layer GIL2 may be higher than an electric potential of a channel region below the second portion GILb. That is, a potential gradient may be formed in the channel region below the reset gate electrode RG. In other words, an electric potential in the channel region below the reset gate electrode RG may be increased with decreasing distance to the first source region SDR1a, to which the pixel power voltage $V_{PIX}$ is applied.

A third gate insulating layer GIL3 may be disposed between the dual conversion gain gate electrode DCG and the semiconductor substrate 100. The third gate insulating layer GIL3 may have substantially the same thickness as the second portion GILb of the second gate insulating layer GIL2.

A fourth gate insulating layer GIL4 may be disposed between the source follower gate electrode SFG and the semiconductor substrate 100. A fifth gate insulating layer (not shown) may be disposed between the selection gate electrode SG and the semiconductor substrate 100. Each of the fourth and fifth gate insulating layers may have substantially the same thickness as the second portion GILb of the second gate insulating layer GIL2.

In an embodiment, the first to fifth gate insulating layers may be formed of or include at least one of silicon oxide, silicon oxynitride, high-k dielectric materials whose dielectric constants are higher than the silicon oxide, or combinations thereof. The high-k dielectric materials may be formed of metal oxide or metal oxynitride. For example, the high-k dielectric materials, which are used for the first to fifth gate insulating layers, may include $HfO_2$, HfSiO, HfSiON, HfTaO, HfTiO, HfZrO, $ZrO_2$, $Al_2O_3$, or combinations thereof, but the inventive concept is not limited to these examples.

Furthermore, although not illustrated in the drawings, interlayer insulating layers may be stacked on the first surface 100a of the semiconductor substrate 100 to cover the transistors, and contact plugs and conductive lines may be disposed in the interlayer insulating layers.

A planarization insulating layer 310, a lattice structure 320, a protection layer 330, color filters 340, micro lenses 350, and a passivation layer 360 may be disposed on the second surface 100b of the semiconductor substrate 100.

For example, the planarization insulating layer 310 may be disposed on the second surface 100b of the semiconductor substrate 100 in a direction opposite from the first surface 100a of the semiconductor substrate 100. The planarization insulating layer 310 may be formed of a transparent insulating material and may include a plurality of layers. The planarization insulating layer 310 may be formed of an insulating material whose refractive index is different from the semiconductor substrate 100. The planarization insulating layer 310 may be formed of or include at least one of metal oxide and/or silicon oxide.

The lattice structure 320 may be disposed on the planarization insulating layer 310. The lattice structure 320 may have a lattice shape, similar to the pixel isolation structure PIS. The lattice structure 320 may be vertically overlapped with the pixel isolation structure PIS. That is, the lattice structure 320 may include first portions extending in the first direction D1, and second portions extending in the second direction D2 to intersect the first portions. A width of the lattice structure 320 may be substantially equal to or smaller than the smallest width of the pixel isolation structure PIS.

The lattice structure 320 may include a light-blocking pattern and/or a low refractive pattern. The light-blocking pattern may be formed of or include metallic materials (e.g., titanium, tantalum, tungsten, etc.). The low refractive pattern may be formed of or include a material having refractive index that is lower than the light-blocking pattern. The low refractive pattern may be formed of an organic material and may have a refractive index of about 1.1 to 1.3. For example, the lattice structure 320 may be a polymer layer, in which silica nano-particles are included.

The protection layer 330 may be provided on the planarization insulating layer 310 to partially or entirely cover a surface of the lattice structure 320 conformally (e.g., to a substantially uniform thickness). The protection layer 330 may be a single- or multi-layered structure including at least one of an aluminum oxide layer and a silicon carbon oxide layer.

The color filters 340 may be disposed at position corresponding to positions of the first and second pixel regions PR1 and PR2, respectively. The color filters 340 may be provided to fill empty regions between the lattice structures 320. The color filters 340 may include red, green, or blue color filters or magenta, cyan, or yellow color filters. The colors may be determined based on positions of the unit pixels.

The micro lenses 350 may be disposed on the color filters 340. The micro lenses 350 may have a convex shape and may have a specific curvature radius. The micro lenses 350 may be formed of or include an optically transparent resin.

The passivation layer 360 may be formed to conformally cover the surfaces of the micro lenses 350. The passivation layer 360 may be formed of or include at least one of, for example, inorganic oxide materials.

Figure 6:
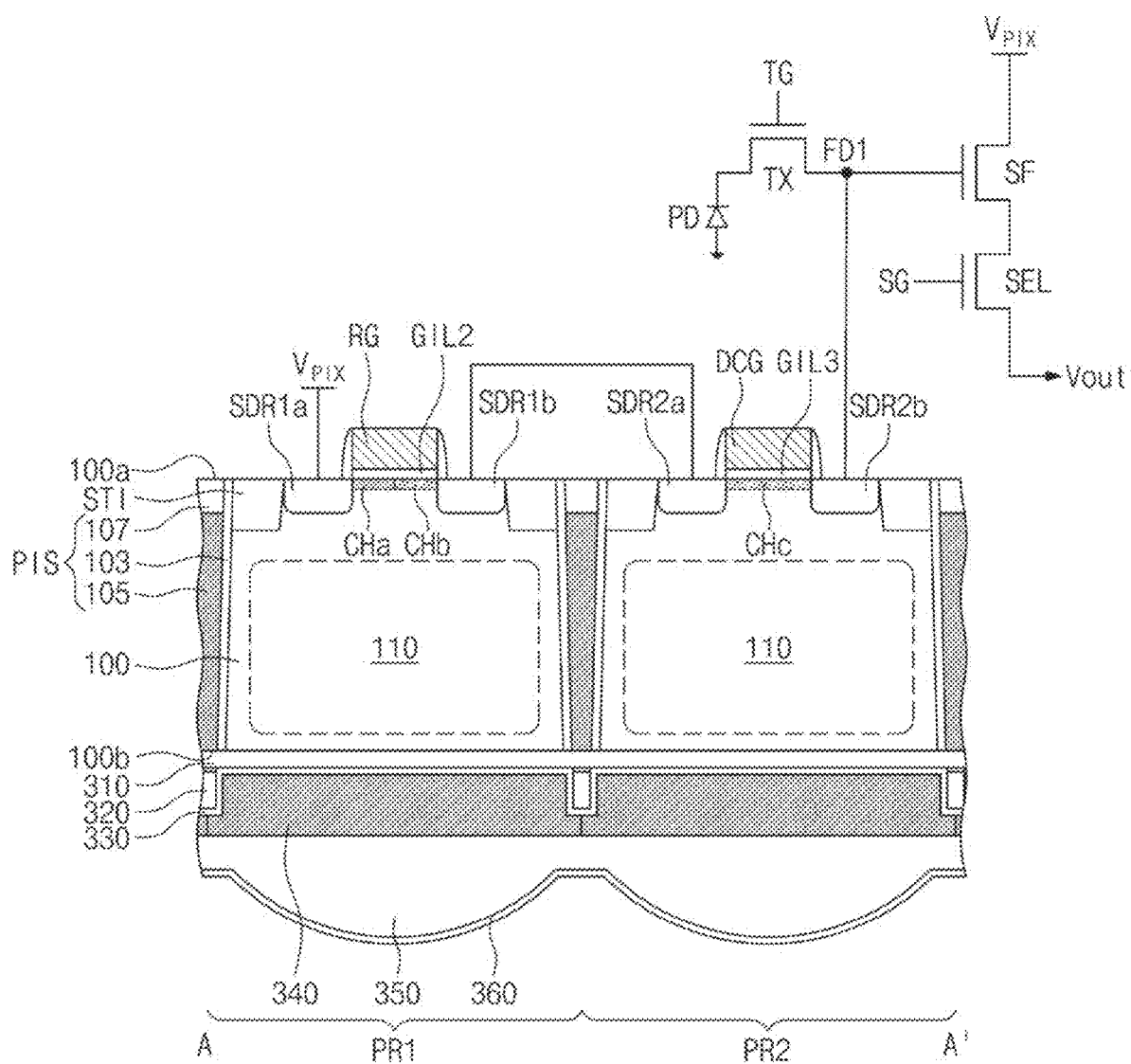
FIGS. 6, 7, and 8 are sectional views, which are taken along the line A-A' of FIG. 4 to illustrate an image sensor according to an embodiment.
Figure 7:
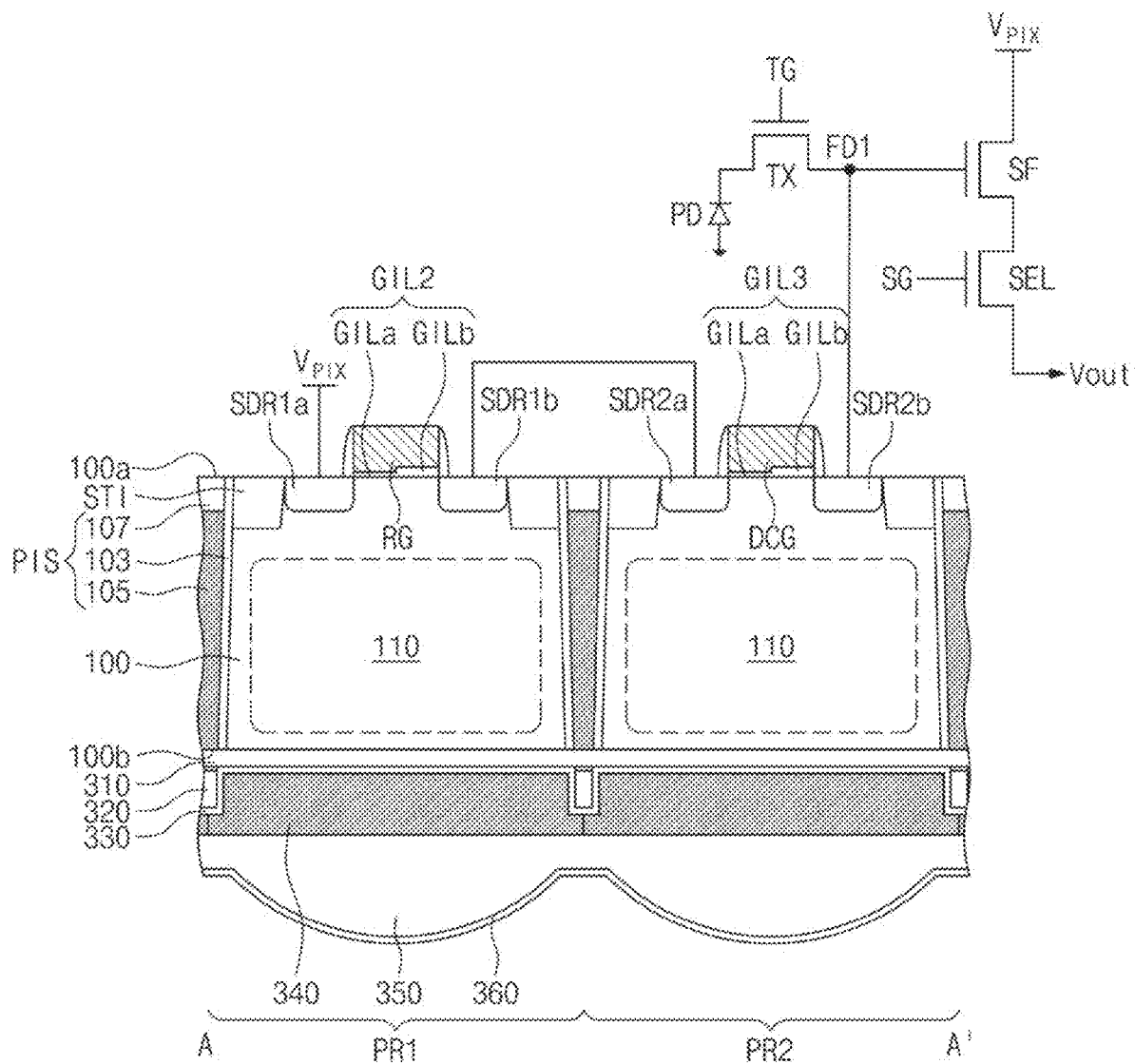
Figure 8:
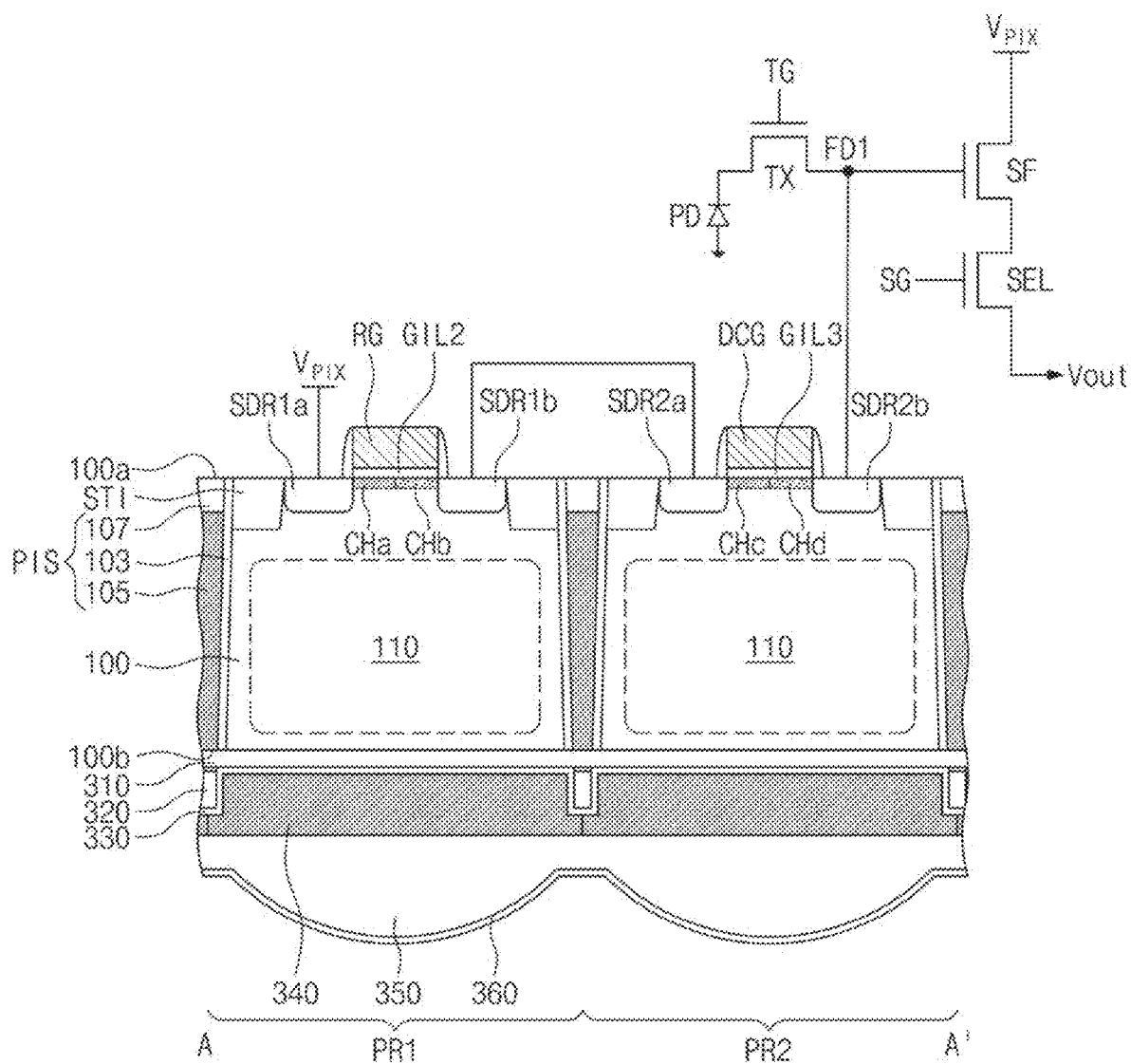

FIGS. 6, 7, and 8 are sectional views, which are taken along the line A-A' of FIG. 4 to illustrate an image sensor according to an embodiment. For concise description, the same element in the image sensor described with reference to FIGS. 4, 5A, and 5B may be identified by the same reference number without repeating an overlapping description thereof.

In the embodiment shown in FIG. 6, a first channel impurity region Cha and a second channel impurity region CHb may be provided in the semiconductor substrate 100 below the reset gate electrode RG. The first and second channel impurity regions CHa and CHb may be disposed between the first source region SDR1a and the first drain region SDR1b. The first channel impurity region CHa may be adjacent to the first source region SDR1a, and the second channel impurity region CHb may be adjacent to the first drain region SDR1b.

The first channel impurity region CHa may be doped to have a second conductivity type that is different from the first conductivity type of the semiconductor substrate 100. An impurity concentration in the first channel impurity region CHa may increase with decreasing distance from the first source region SDR1a. Alternatively, the impurity concentration in the first channel impurity region CHa may be substantially uniform.

The second channel impurity region CHb may be an undoped region. Alternatively, the second channel impurity region CHb may be formed by a doping process of injecting impurities having the same conductivity type (e.g., the first conductivity type) as the semiconductor substrate 100. In an embodiment, the second channel impurity region CHb may be doped to have the second conductivity type different from the semiconductor substrate 100, and in this case, an impurity concentration in the second channel impurity region CHb may be lower than that in the first channel impurity region CHa.

Since, as described above, the first and second channel impurity regions CHa and CHb below the reset gate electrode RG are formed to be asymmetric to each other, a potential gradient may be formed in the channel region below the reset gate electrode RG. In other words, an electric potential in the channel region below the reset gate electrode RG may increase with decreasing distance from the first source region SDR1a, to which the pixel power voltage is applied.

The second gate insulating layer GIL2 below the reset gate electrode RG may have substantially uniform thickness, and the thickness of the second gate insulating layer GIL2 may be substantially equal to a thickness of the third gate insulating layer GIL3.

A third channel impurity region CHc may be provided in the semiconductor substrate 100 below the dual conversion gain gate electrode DCG. The third channel impurity region CHc may be formed to have the second conductivity type that is different from the first conductivity type of the semiconductor substrate 100. As an example, an impurity concentration in the third channel impurity region CHc may be substantially equal to that in the first channel impurity region CHa.

In the embodiment shown in FIG. 7, the third gate insulating layer GIL3 below the dual conversion gain gate electrode DCG may include the first and second portions GILa and GILb, like the second gate insulating layer GIL2. In other words, the first portion GILa of the third gate insulating layer GIL3 may have a first thickness, and the second portion GILb may have a second thickness that is larger than the first thickness.

The first portion GILa of the third gate insulating layer GIL3 may be adjacent to the second source region SDR2a, and the second portion GILb of the third gate insulating layer GIL3 may be adjacent to the second drain region SDR2b. Accordingly, an electric potential in the channel region below the dual conversion gain gate electrode DCG may increase in a direction from the second drain region SDR2b toward the second source region SDR2a.

In the embodiment shown in FIG. 8, the first and second channel impurity regions CHa and CHb may be provided in the semiconductor substrate 100 below the reset gate electrode RG, and third and fourth channel impurity regions CHc and CHd may be provided in the semiconductor substrate 100 below the dual conversion gain gate electrode DCG.

The first channel impurity region CHa may be adjacent to the first source region SDR1a, and the second channel impurity region CHb may be adjacent to the first drain region SDR1b. The third channel impurity region CHc may be adjacent to the second source region SDR2a, and the fourth channel impurity region CHd may be adjacent to the second drain region SDR2b.

The first and third channel impurity regions CHa and CHc may be formed to have the second conductivity type that is different from the first conductivity type of the semiconductor substrate 100. An impurity concentration in the first channel impurity region CHa may increase with decreasing distance from the first source region SDR1a, and an impurity concentration in the third channel impurity region CHc may increase with decreasing distance from the second source region SDR2a.

The second and fourth channel impurity regions CHb and CHd may be undoped regions. Alternatively, the second and fourth channel impurity regions CHb and CHd may be doped to have the same conductivity type (e.g., the first conductivity type) as the semiconductor substrate 100. In an embodiment, the second and fourth channel impurity regions CHb and CHd may have the second conductivity type that is different from the semiconductor substrate 100, and impurity concentrations in the second and fourth channel impurity regions CHb and CHd may be lower than impurity concentrations in the first and third channel impurity regions CHa and CHc.

Figure 9:
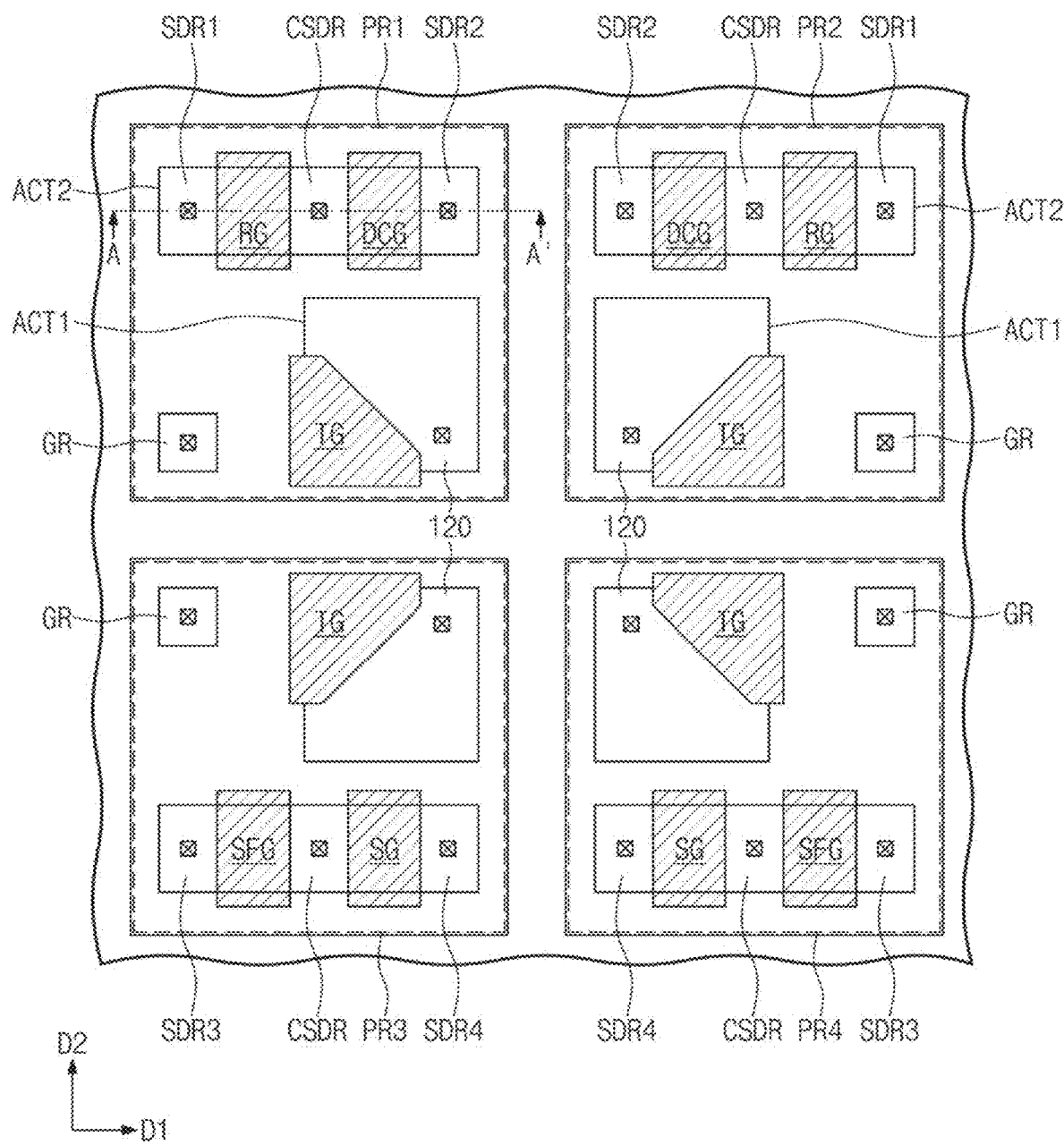
FIG. 9 is a plan view illustrating a unit pixel of an image sensor according to an embodiment.
Figure 10A:
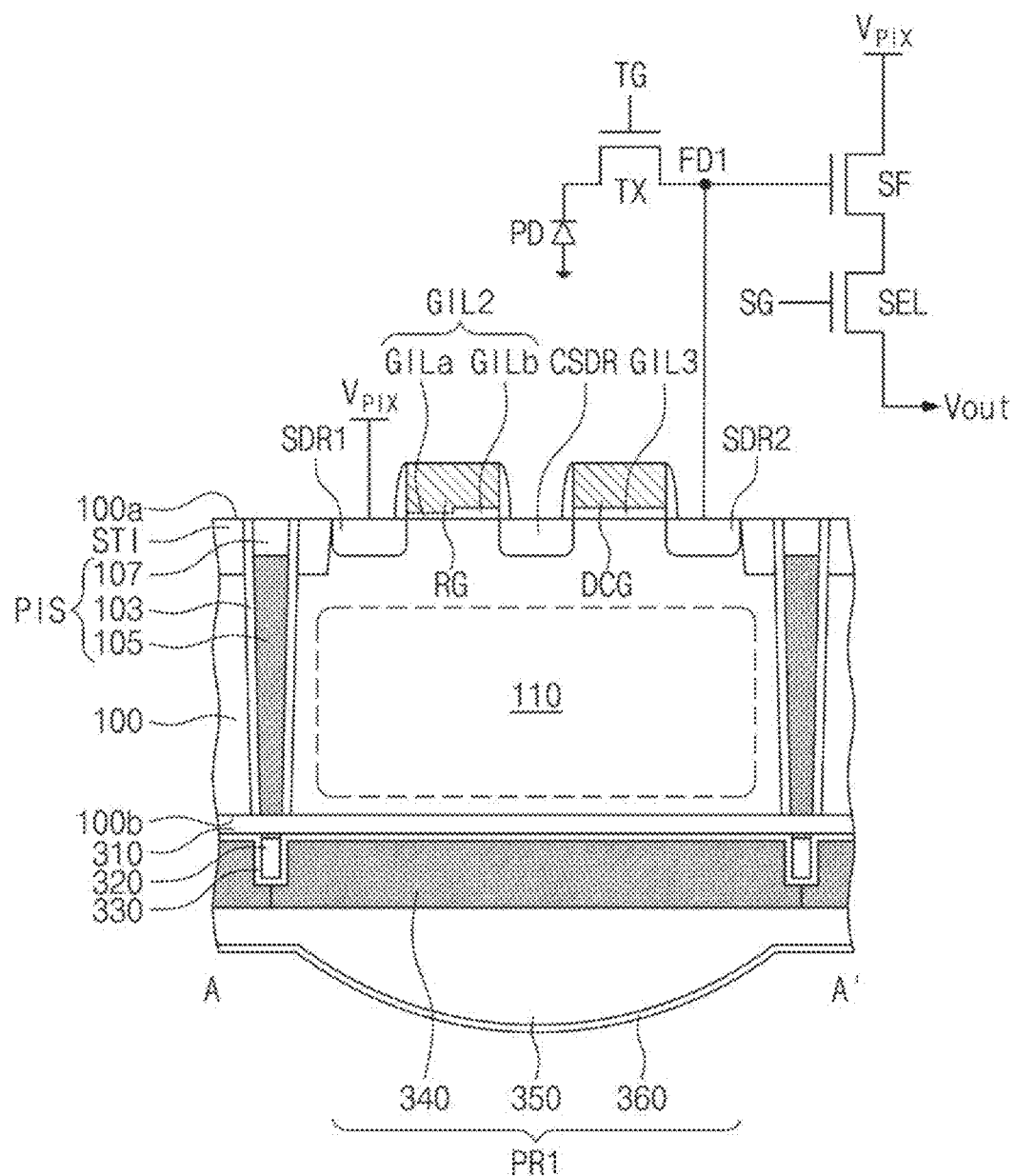
FIGS. 10A and 10B are sectional views, which are taken along a line A-A' of FIG. 9 to illustrate an image sensor according to an embodiment.
Figure 10B:
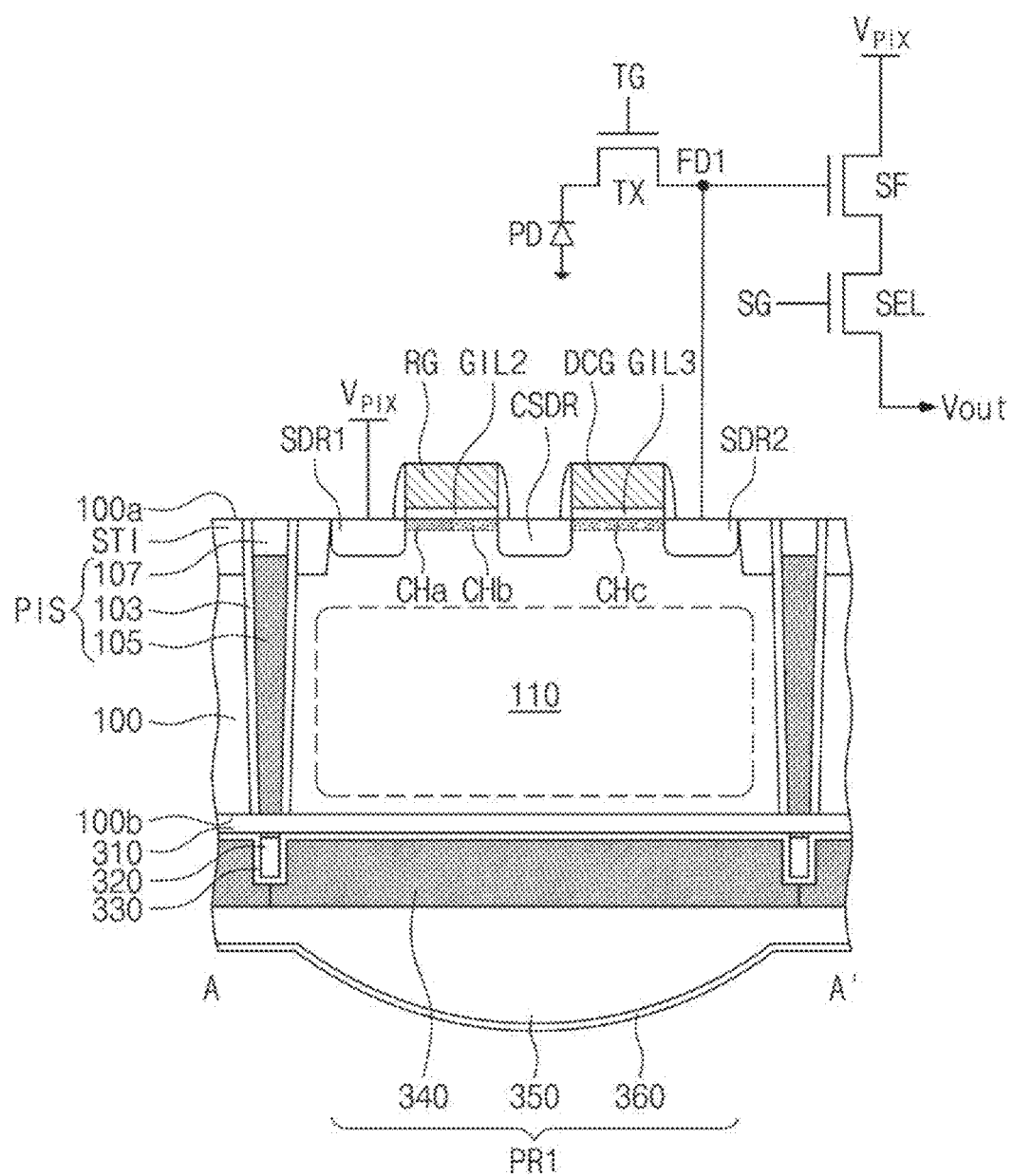

FIG. 9 is a plan view illustrating a unit pixel of an image sensor according to an embodiment. FIGS. 10A and 10B are sectional views, which are taken along a line A-A' of FIG. 9 to illustrate an image sensor according to an embodiment. For concise description, the same element in the image sensor described with reference to FIGS. 4, 5A, and 5B may be identified by the same reference number without repeating an overlapping description thereof.

Referring to FIGS. 9, 10A, and 10B, the device isolation layer STI may be provided to define the first and second active portions ACT2 in each of the pixel regions PR1 to PR4. A pair of pixel transistors, which are included in the pixel transistors constituting the unit pixel, may be provided on the second active portion ACT2 in each of the pixel regions PR1 to PR4.

As an example, the reset gate electrode RG and the dual conversion gain gate electrode DCG may be disposed on the second active portion ACT2 of each of the first and second pixel regions PR1 and PR2, respectively. In other words, both of the reset gate electrode RG and the dual conversion gain gate electrode DCG may be disposed on one of the second active portions ACT2. The source follower gate electrode SFG and the selection gate electrode SG may be disposed on the second active portion ACT2 of each of the third and fourth pixel regions PR3 and PR4, respectively.

Although an example in which two pixel transistors are provided on each second active portion ACT2 has been described, the inventive concept is not limited to this example. The arrangement of the pixel transistors may be variously changed.

In an embodiment, a common impurity region CSDR may be provided in the second active portion ACT2 between the reset gate electrode RG and the dual conversion gain gate electrode DCG. A first source and drain region SDR1 may be provided in the second active portion ACT2 at a side of the reset gate electrode RG, and a second source and drain region SDR2 may be provided in the second active portion ACT2 at a side of the dual conversion gain gate electrode DCG that is opposite from the side of the reset gate electrode RG. The first source and drain region SDR1, the common impurity region CSDR, and the second source and drain regions SDR2 may be formed by an impurity injection process and may have a conductivity type different from the semiconductor substrate 100.

Moreover, referring to FIG. 9, the common impurity region CSDR may be provided in the second active portion ACT2 between the source follower gate electrode SFG and the selection gate electrode SG. A third source and drain region SDR3 may be provided in the second active portion ACT2 at a side of the source follower gate electrode SFG, and a fourth source and drain region SDR4 may be provided in the second active portion ACT2 at a side of the selection gate electrode SG that is opposite from the side of the source follower gate electrode SFG.

Furthermore, referring to FIG. 10A, the second gate insulating layer GIL2 below the reset gate electrode RG may include the first portion GILa and the second portion GILb that have different thicknesses from each other, as previously described with reference to FIG. 5A. The third gate insulating layer GIL3 below the dual conversion gain gate electrode DCG may be formed.

Referring to FIG. 10B, the semiconductor substrate 100 below the reset gate electrode RG may include the first and second channel impurity regions CHa and CHb, and the semiconductor substrate 100 below the dual conversion gain gate electrode DCG may include the third channel impurity region CHc. The first, second, and third channel impurity regions CHa, CHb, and CHc may include substantially the same features as the embodiment described with reference to FIG. 6.

Figure 11:
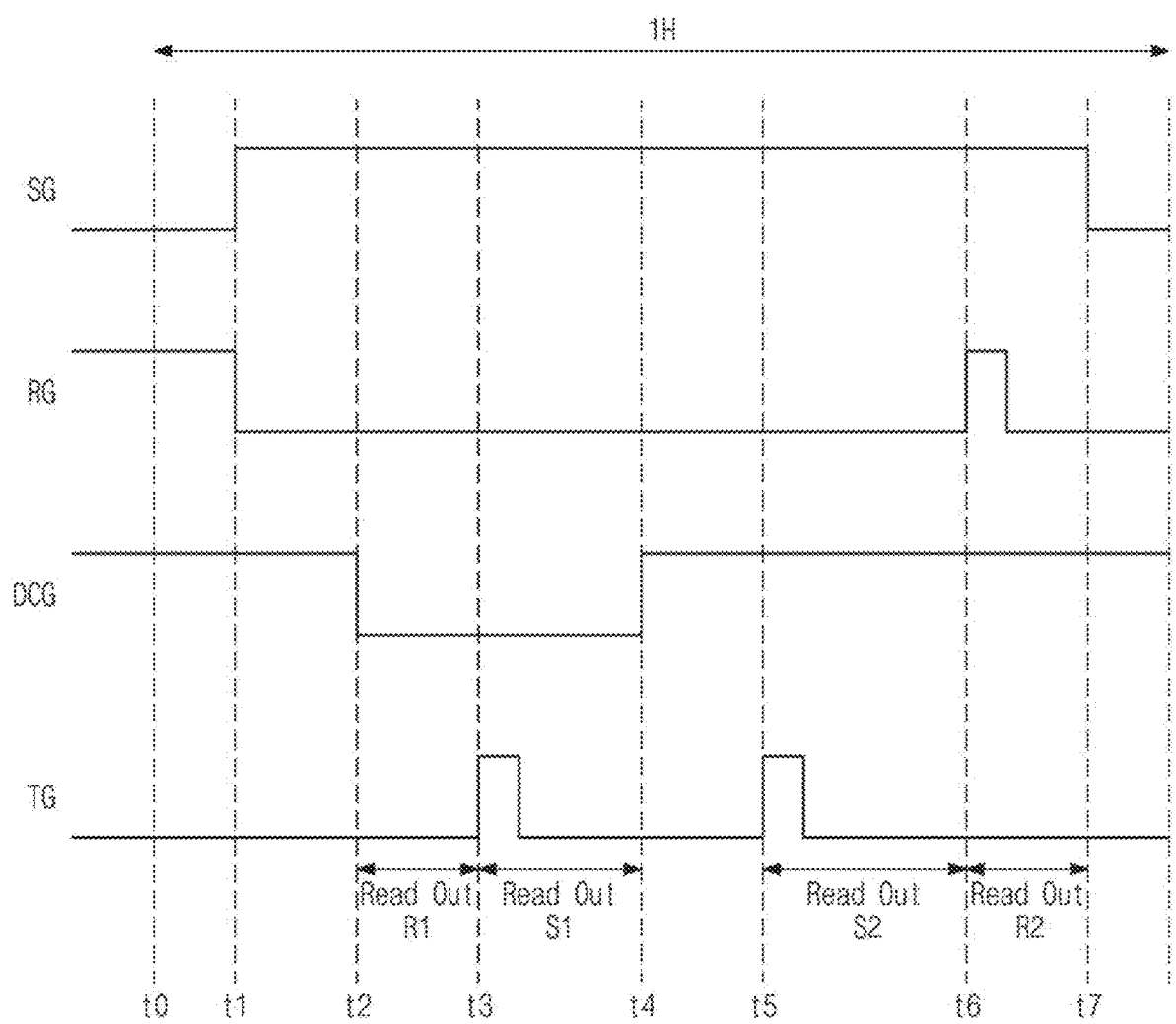
FIG. 11 is a timing diagram illustrating an operation of an image sensor according to an embodiment.

FIG. 11 is a timing diagram illustrating an operation of an image sensor according to an embodiment. FIGS. 12A to 12F are diagrams illustrating electric potential levels of a unit pixel during an operation of an image sensor, according to an embodiment.

FIG. 11 illustrates an operation of each unit pixel outputting respective pixel signals during a horizontal period 1H. The horizontal period may be a length of time that is taken to obtain a pixel signal from one of column lines (e.g., the output lines) after selecting one of the selection lines using a controller of the image sensor.

In an embodiment, a plurality of pixel signals S1 and S2 may be output from a selected unit pixel during the same effective integration time (hereinafter, EIT).

Figure 12A:
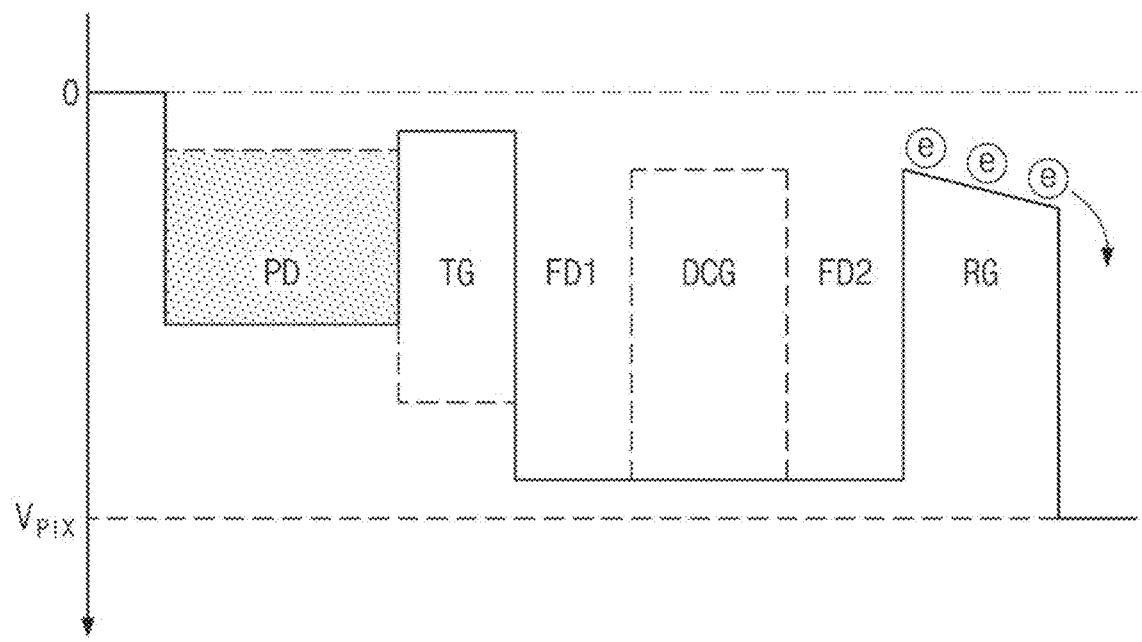
FIGS. 12A to 12F are diagrams illustrating electric potential levels of a unit pixel during an operation of an image sensor, according to an embodiment.

Referring to FIGS. 3A, 11, and 12A, to reset the first and second charge detection nodes FD1 and FD2 (or the first and second floating diffusion regions), the reset signal RG and the dual conversion gain control signal DCG may be maintained to a high level during the time interval from t0 to t1. Accordingly, the reset transistor RX and the dual conversion gain transistor DCX may be turned on, and in this case, electric charges may be discharged from the first and second charge detection nodes FD1 and FD2. In other words, the first and second charge detection nodes FD1 and FD2 may be reset.

At the time t1, the reset signal RG may be changed to a low level. In this case, the reset transistor RX may be turned off. As a result, the first and second charge detection nodes FD1 and FD2 may be in a charge storable state.

Referring to FIG. 12A, immediately after the reset transistor RX is turned off, electric charges in the channel region of the reset transistor RX may be drained to a pixel power voltage (VDD) terminal, because of a potential gradient at the channel region of the reset transistor RX. Accordingly, in the first conversion gain mode, it may be possible to reduce a change of a reset noise in the first and second charge detection nodes FD1 and FD2.

If the reset signal RG is changed to the low level, the selection signal SG may be immediately changed to the high level. In this case, the selection transistor SEL may be turned on. If the selection transistor SEL is turned on, outputting of the pixel signals may be allowed.

Electric charges may be accumulated in the photoelectric conversion device PD, during the resetting of the first and second charge detection nodes FD1 and FD2.

At the time t2 after the resetting of the first and second charge detection nodes FD1 and FD2, the dual conversion gain control signal DCG may be changed to a low level. Accordingly, the dual conversion gain transistor DCX may be turned off. In the case where the dual conversion gain transistor DCX is turned off, the unit pixel may be operated in the first conversion gain mode (or high brightness mode) having a first conversion gain.

At time t3, the transfer signal TG may be changed to a high level, and the photocharges accumulated in the photoelectric conversion devices PD may be transferred to the first charge detection node FD1 while the transfer transistor TX is turned on. At this time, a charge storing capacity of the first charge detection node FD1 may correspond to a capacitance of the first charge detection node FD1.

Figure 12B:
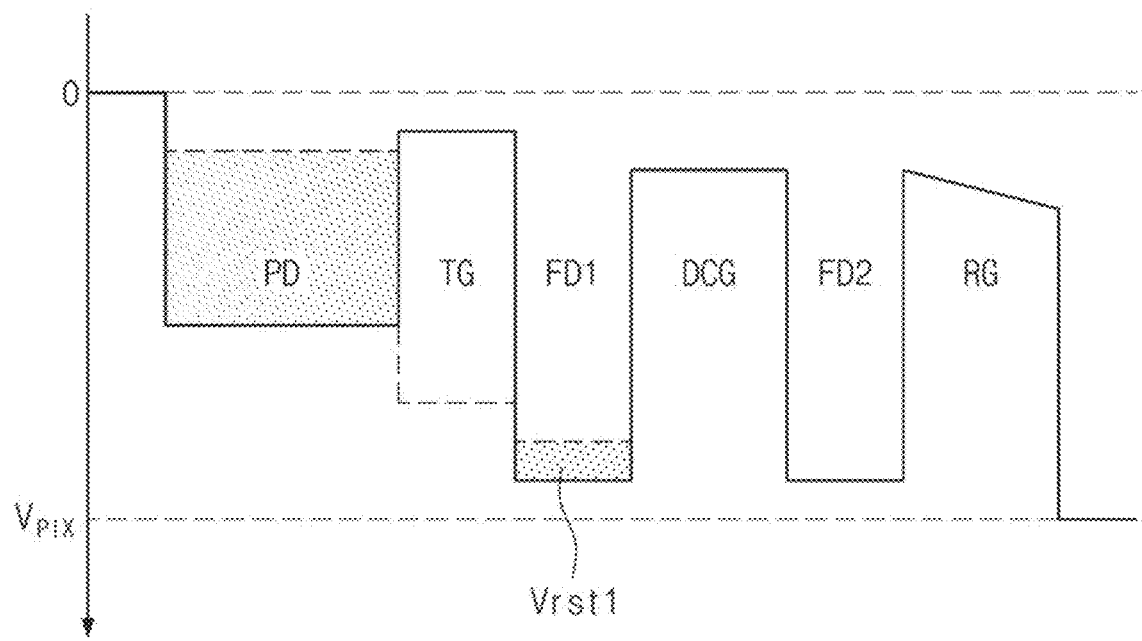

Referring to FIGS. 11 and 12B, a first reset signal R1, which is in proportion to an electric potential (e.g., a first reset voltage Vrst1) at the first charge detection node FD1, may be output during a first output interval (e.g., between the time points t2 and t3).

Figure 12C:
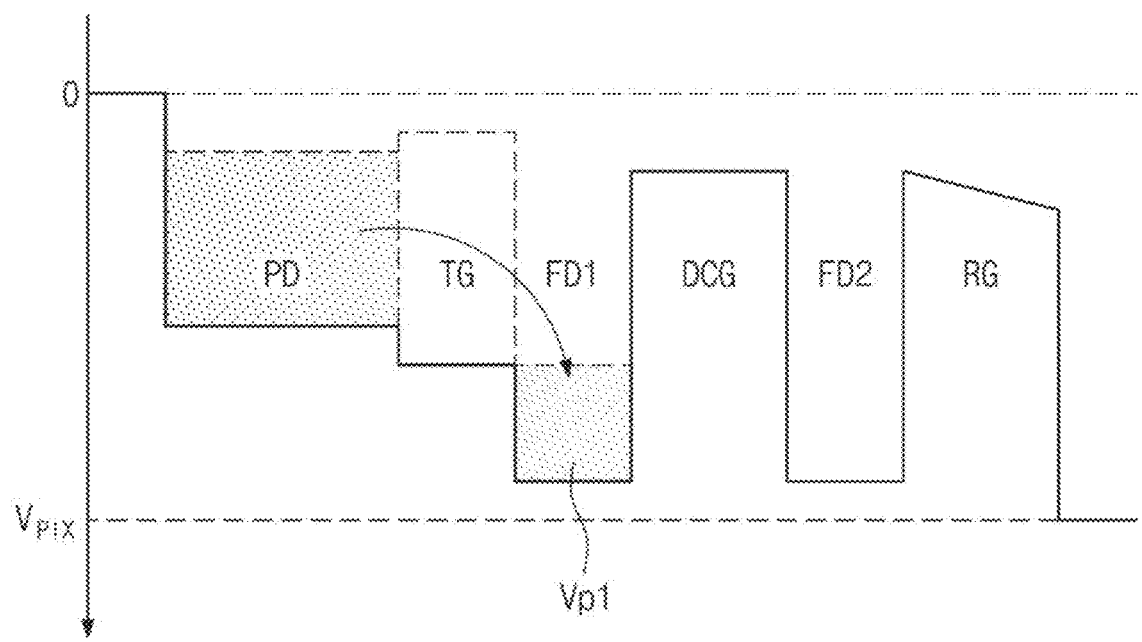

Referring to FIGS. 11 and 12C, the first reset signal R1 may be readout, and then, the transfer transistor TX may be turned on. In this case, electric charges, which are accumulated in the photoelectric conversion devices PD in the first conversion gain mode, may be transferred to the first charge detection node FD1.

A first pixel signal S1, which is in proportion to an amount of photo-charges accumulated in the first conversion gain mode (e.g., a first pixel voltage Vp1), may be output, during a second output interval (e.g., between the time points t3 and t4 or from the turn-off of the transfer transistor TX to the time t4 when the dual conversion gain control signal DCG is changed to a high level).

Figure 12D:
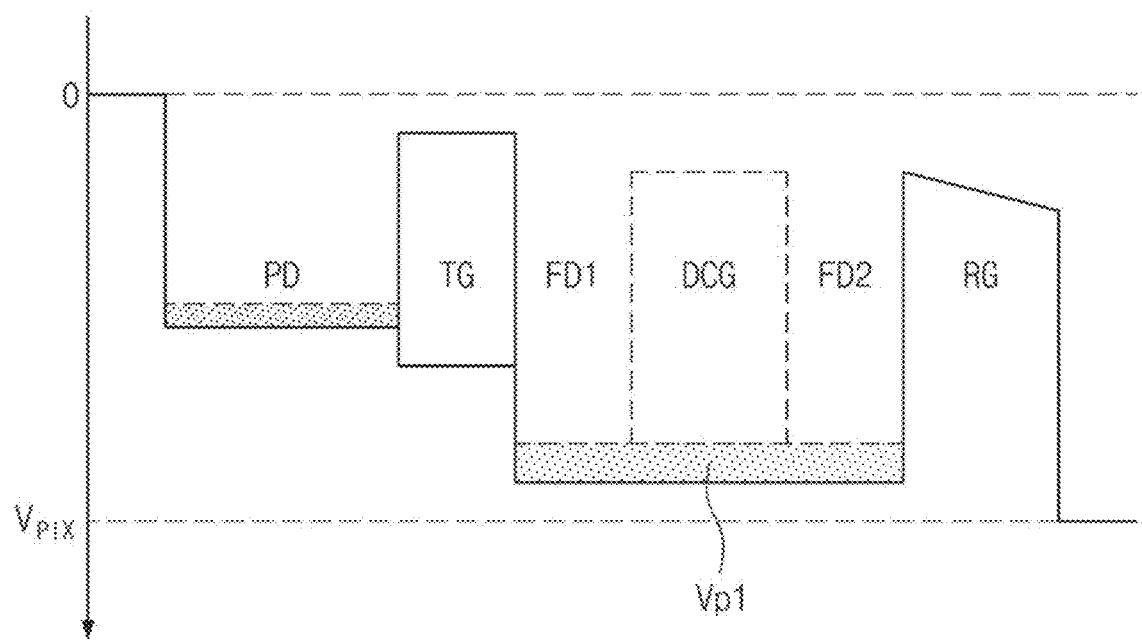

Referring to FIG. 12D, at the time t4, when the dual conversion gain control signal DCG is changed to the high level and thereby turning on the dual conversion gain transistor DCX, the unit pixel may be operated in the second conversion gain mode (or low brightness mode) having a second conversion gain greater than the first conversion gain. Since the dual conversion gain transistor DCX is turned on, an electrostatic capacitance of the first charge detection node FD1 may be increased to a sum of electrostatic capacitances of the first and second charge detection nodes FD1 and FD2.

After the dual conversion gain transistor DCX is turned on, the transfer signal TG may be changed to the high level at time t5, and in this case, the transfer transistor TX may be turned on. Then, photocharges accumulated in the photoelectric conversion device PD during a time interval between the time points t3 and t5 may be transferred to the first charge detection node FD1.

Figure 12E:
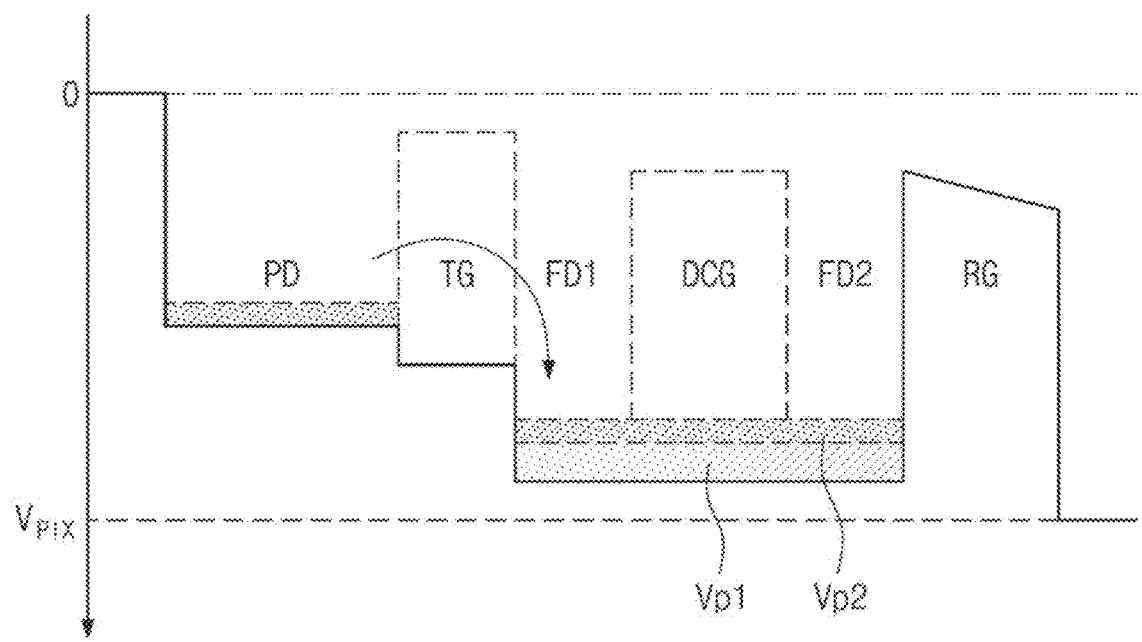

Referring to FIGS. 11 and 12E, a second pixel signal S2, which is in proportion to an amount of photo-charges accumulated in the second conversion gain mode (e.g., a second pixel voltage Vp2), may be output, during a third output interval (e.g., between the time points t5 and t6 or from the turn-off of the transfer transistor TX to the time t6 when the reset signal RG is changed to the high level).

At the time t6, the reset transistor RX may be turned on to reset the first and second charge detection nodes FD1 and FD2 again. At time t7, if the selection signal SG is changed to the low level, the selection transistor SEL may be turned off. In this case, the outputting of the sensing signal from the unit pixel may not be allowed.

Figure 12F:
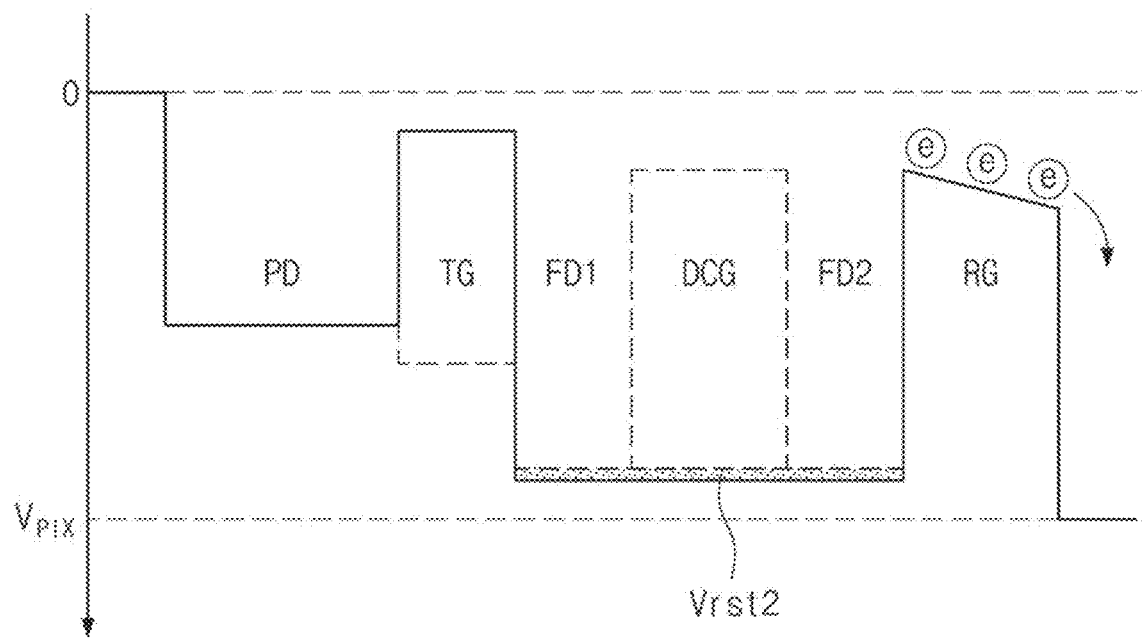

Referring to FIGS. 11 and 12F, a second reset signal R2, which is in proportion to an electric potential at the first charge detection node FD1 (e.g., a second pixel voltage Vrst2), may be output immediately after the second resetting of the first and second charge detection nodes FD1 and FD2 performed during a fourth output interval (e.g., between the time points t6 and t7). After the second resetting, an amount of electric charges in the first and second charge detection nodes FD1 and FD2 may be minimized by a potential gradient in the channel region of the reset transistor RX. That is, a charge amount in the first and second charge detection nodes FD1 and FD2 after the second resetting may be smaller than a charge amount in the first and second charge detection nodes FD1 and FD2 after the first resetting. That is, it may be possible to reduce or remove a kT/C noise in the unit pixel, and thus, the second reset signal R2 in the second conversion gain mode may be read out after the reading out of the second pixel signal S2. Accordingly, an additional memory element (e.g., a capacitor or a memory device), which is used to store the second reset signal R2, may be omitted.

Figure 13:
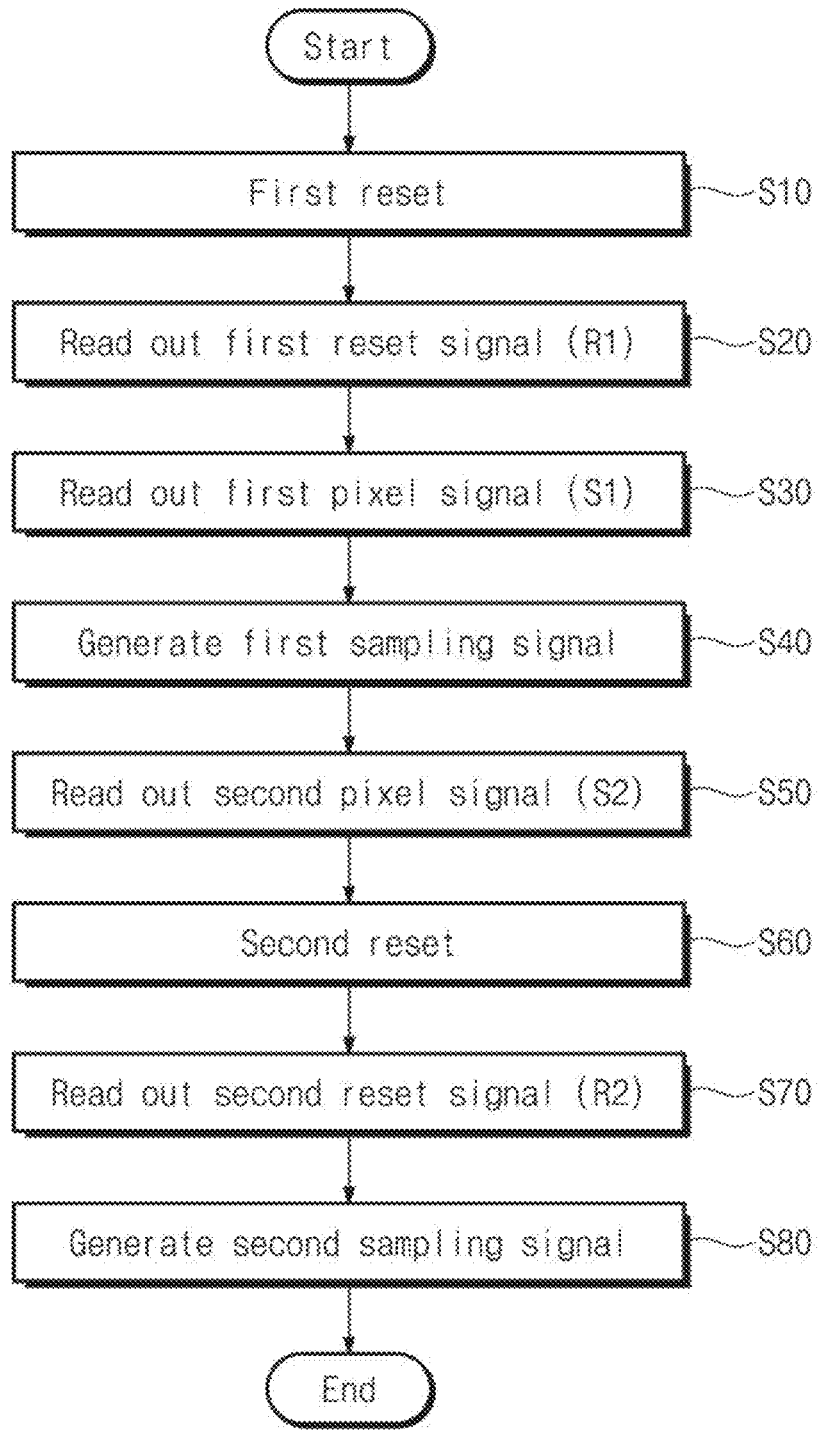
FIG. 13 is a flow chart illustrating a method of operating an image sensor according to an embodiment.

FIG. 13 is a flow chart illustrating a method of operating an image sensor according to an embodiment. According to an embodiment of the inventive concept, sampling signals in the first and second conversion gain modes of the unit pixel may be obtained through the first charge detection node.

Referring to FIG. 13, a first reset step may be performed to turn on the dual conversion gain transistor and the reset transistor of the unit pixel and thereby resetting the first and second charge detection nodes (in S10). That is, electric charges accumulated in the first and second charge detection nodes may be drained to the pixel power voltage terminal.

The dual conversion gain transistor may be turned off, and then the first reset signal R1, which is in proportion to an amount of charges accumulated in the first charge detection node, may be read out (in S20). The unit pixel may be operated in the first conversion gain mode by turning off the dual conversion gain transistor, and in the first conversion gain mode, an electrostatic capacitance of the first charge detection node FD1 may be determined as the first capacitance CFD1. That is, a conversion gain of the unit pixel in the first conversion gain mode may be determined as a first value corresponding to the first capacitance of the first capacitor $C_{FD1}$.

After the reading of the first reset signal R1, the transfer transistor TX may be turned on, and in this case, electric charges accumulated in the photoelectric conversion region in the first conversion gain mode may be transferred to the first charge detection node. Accordingly, the first pixel signal S1, which is in proportion to an amount of charges accumulated in the photoelectric conversion region in the first conversion gain mode, may be read out (in S30).

After the reading of the first pixel signal S1, a first sampling in the first conversion gain mode may be executed by the correlated dual sampler (CDS). As a result, a first sampling signal corresponding to a difference between the first reset signal R1 and the first pixel signal S1 may be generated (in S40).

Next, the dual conversion gain transistor may be turned on, and the unit pixel may be operated in the second conversion gain mode. An electrostatic capacitance of the first charge detection node in the second conversion gain mode may be determined as a sum of the first and second capacitances of the first and second charge detection nodes (e.g., $C_{FD1}$ $C_{FD2}$). Accordingly, a conversion gain of the unit pixel may have a second value that is smaller than the first value.

In the second conversion gain mode, the transfer transistor TX may be again turned on, and electric charges accumulated in the photoelectric conversion region in the second conversion gain mode may be transferred to the first and second charge detection nodes. Accordingly, the second pixel signal S2 from the first charge detection node may be read out (in S50).

After the reading of the second pixel signal S2, a second reset step may be executed to reset the first and second charge detection nodes of the unit pixel (in S60). That is, electric charges accumulated in the first and second charge detection nodes may be drained to the pixel power voltage terminal.

Thereafter, the reset transistor may be turned off and the dual conversion gain transistor may be turned on, and the second reset signal R2, which is in proportion to an amount of charges left in the first and second charge detection nodes may be read out (in S70).

After the reading of the second reset signal R2, a second sampling in the second conversion gain mode may be executed by the correlated dual sampler (CDS). That is, a second sampling signal corresponding to a difference between the second reset signal R2 and the second pixel signal S2 may be generated (in S80).

According to an embodiment of the inventive concept, since a potential gradient is provided in the channel region of the reset transistor, it may be possible to reduce a reset noise, which is caused by electrons left in a floating diffusion region immediately after a reset operation. Accordingly, it may be possible to reduce a signal-to-noise ratio (SNR) dip phenomenon, in which a SNR varies discontinuously at a point of time when a first conversion gain is changed to a second conversion gain.

Since the SNR dip phenomenon is suppressed, the second pixel signal S2 of the second conversion gain mode may be read out, and then, the second reset signal R2 of the second conversion gain mode may be read out.

After the reading of the second pixel signal S2, the second sampling signal may be generated by reading out the second reset signal R2. That is, in the case where the first and second reset signals R1 and R2 are successively read out, it may be possible to omit an additional memory device or capacitor, which is used to temporarily store the second reset signal R2. Accordingly, it may be possible to increase an integration density of the image sensor.

Figure 14:
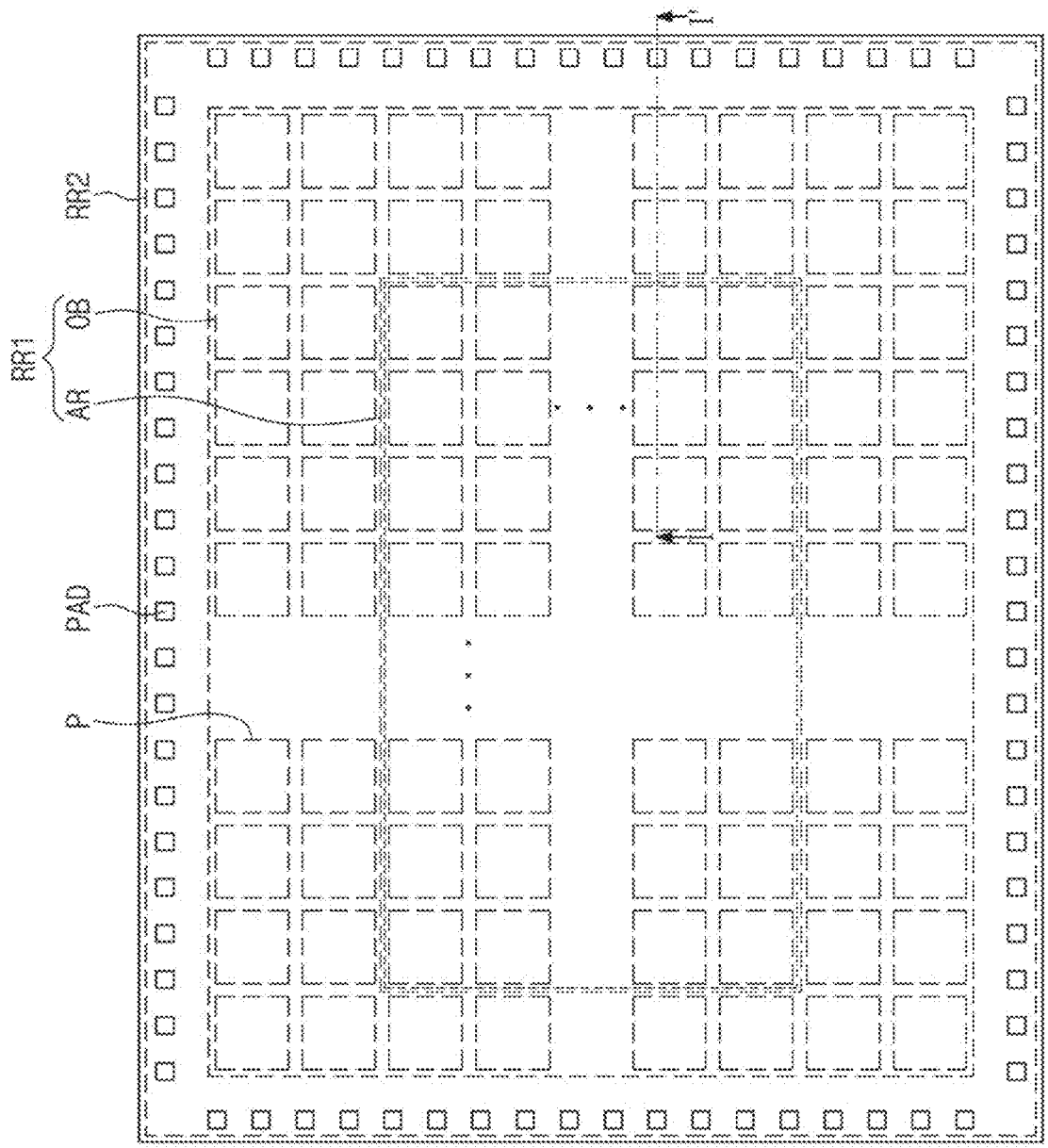
FIG. 14 is a schematic plan view illustrating an image sensor including a semiconductor device according to an embodiment.
Figure 15:
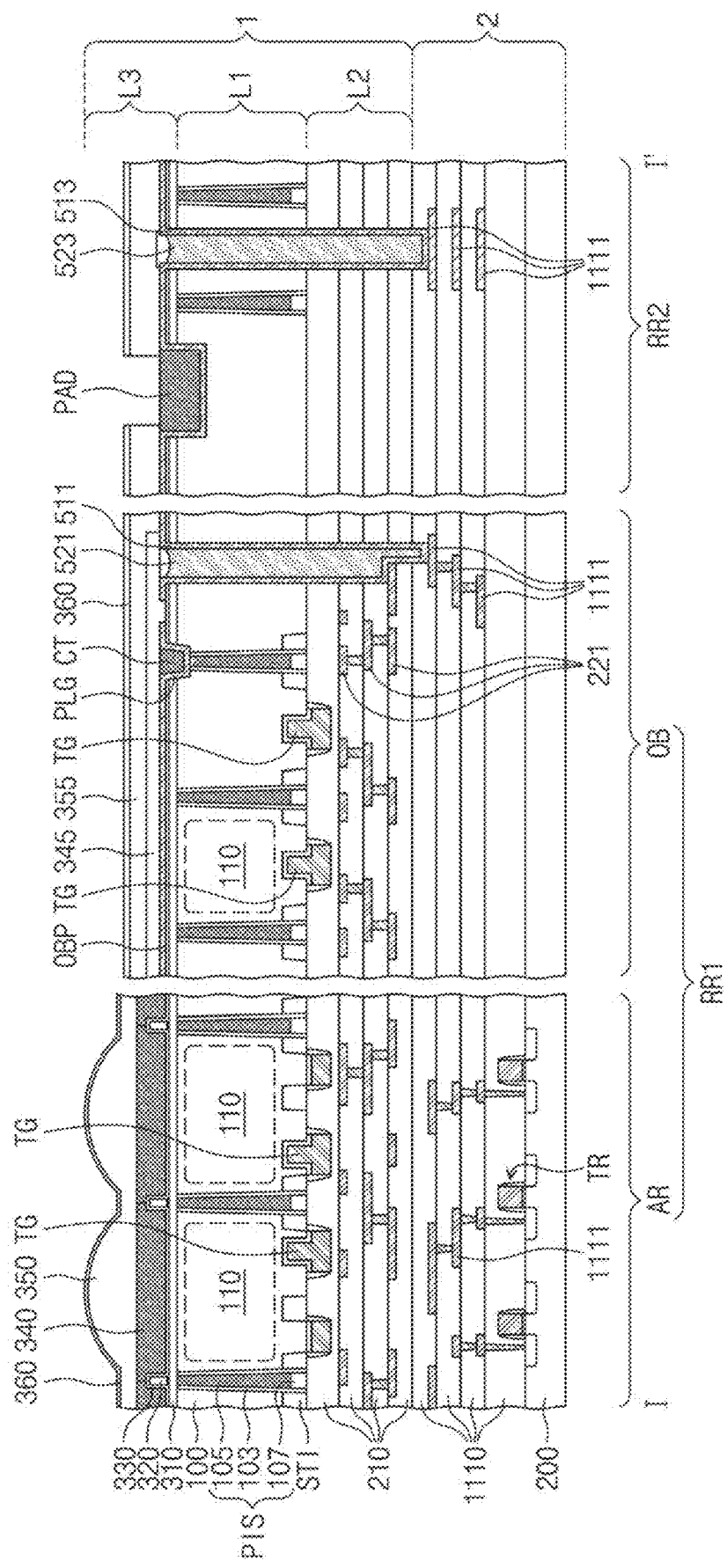
FIGS. 15 and 16 are sectional views, which are taken along a line I-I' of FIG. 14 to illustrate an image sensor according to an embodiment.
Figure 16:
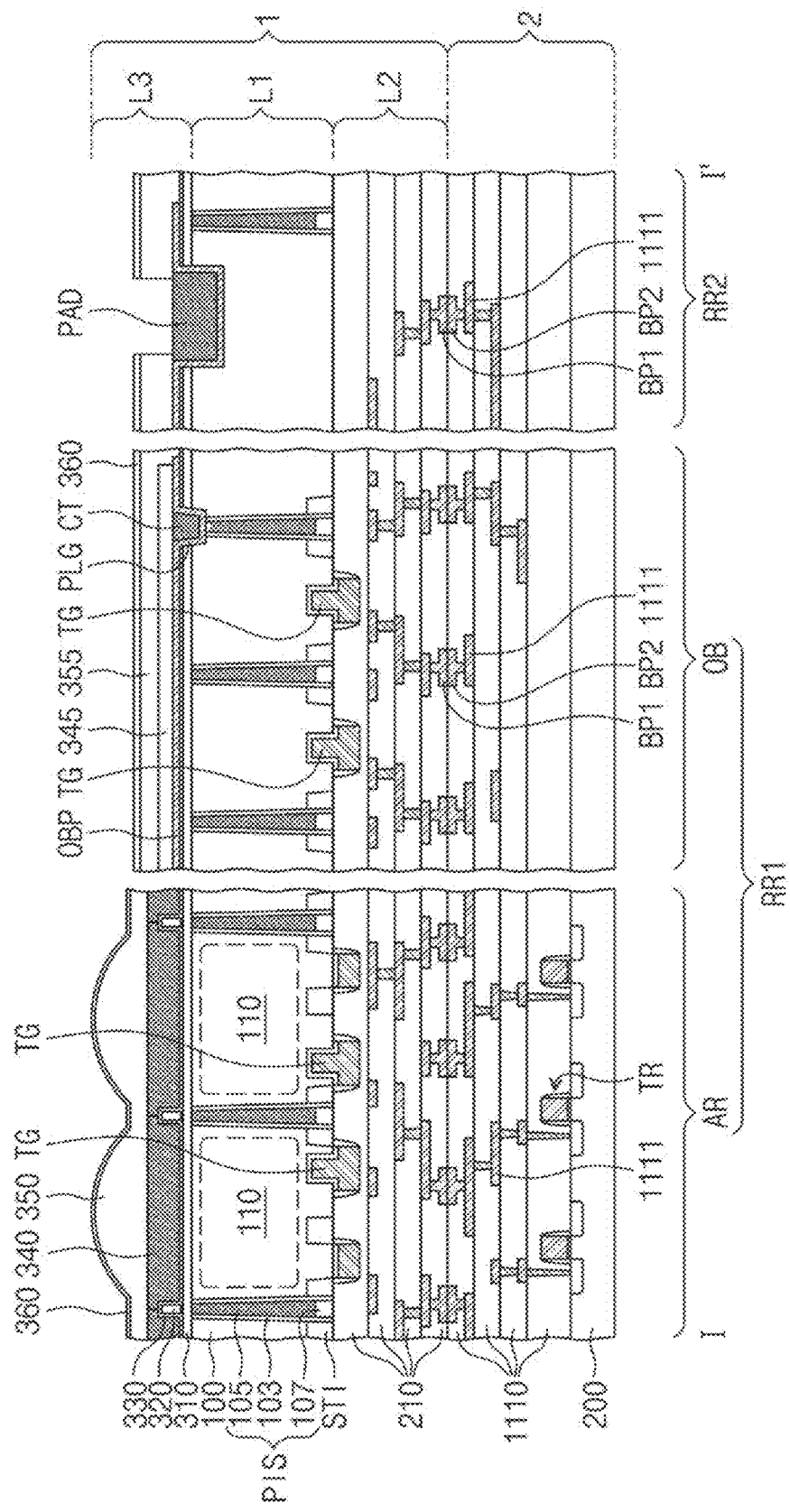

FIG. 14 is a schematic plan view illustrating an image sensor including a semiconductor device according to an embodiment. FIGS. 15 and 16 are sectional views, which are taken along a line I-I' of FIG. 14 to illustrate an image sensor according to an embodiment.

Referring to FIGS. 14 and 15, the image sensor may include a sensor chip 1 and a logic chip 2. The sensor chip 1 may include a pixel array region RR1 and a pad region RR2.

The pixel array region RR1 may include a plurality of the unit pixels P, which are two-dimensionally arranged in two different directions (e.g., the first and second directions D1 and D2). Each of the unit pixels P may include a photoelectric conversion device and read-out devices. An electrical signal, which is proportional to an incident light, may be output from each of the unit pixels P of the pixel array region RR1.

The pixel array region RR1 may include a light-receiving region AR and a light-blocking region OB. The light-blocking region OB may enclose the light-receiving region AR. For example, the light-blocking region OB may surround the light-receiving region AR in four different directions (e.g., up, down, left, and rights directions). In an embodiment, reference pixels, to which light is not incident, may be provided in the light-blocking region OB. Here, by comparing a charge amount obtained by sensing the unit pixel in the light-receiving region AR, with an amount of reference charges produced in the reference pixels, it may be possible to calculate a magnitude of an electrical signal sensed from the unit pixel.

A plurality of conductive pads PAD, which are used to input or output control signals and photoelectric signals, may be disposed in the pad region RR2. The pad region RR2 may be provided to enclose the pixel array region RR1, and in this case, it may be possible to facilitate an electric connection and an image sensor and an external device. The conductive pads PAD may be used to transmit electrical signals, which are produced in the unit pixels P, to an external device.

The sensor chip 1 may include a readout circuit layer L2, an optically-transparent layer L3, a photoelectric conversion layer L1, which is interposed between the readout circuit layer L2 and the optically-transparent layer L3 in a vertical direction. The photoelectric conversion layer L1 of the sensor chip 1 may include the semiconductor substrate 100, the pixel isolation structure PIS defining the pixel regions, and the photoelectric conversion regions 110 provided in the pixel regions, as described above.

In the light-receiving region AR, the sensor chip 1 may include the same technical features as the image sensor described above. In the light-blocking region OB, the optically-transparent layer L3 may include a light-blocking pattern OBP, a contact plug PLG, a contact pattern CT, an organic layer 355, and the passivation layer 360.

The pixel isolation structure PIS may be disposed in the semiconductor substrate 100 of the light-blocking region OB. In the light-blocking region OB, a portion of the pixel isolation structure PIS may be electrically connected to the contact plug PLG. The contact pattern CT may be buried in a contact hole provided with the back-side contact plug PLG.

The planarization insulating layer 310 may extend from the light-receiving region AR to the light-blocking region OB and the pad region RR2.

In the light-blocking region OB, a light-blocking pattern OBP may be disposed on the planarization insulating layer 310. The light-blocking pattern OBP may prevent light from being incident upon the photoelectric conversion regions 110 provided in the light-blocking region OB. The photoelectric conversion regions 110 in the reference pixels of the light-blocking region OB may be configured to output a noise signal without outputting a photoelectric signal. The noise signal may be produced by electrons which are generated when there is heat, dark current, or the like. The light-blocking pattern OBP may be formed of or include metallic materials (e.g., tungsten, copper, aluminum, or alloys thereof).

A filtering layer 345 may be provided on the light-blocking pattern OBP. The filtering layer 345 may be disposed to block light whose wavelength is different from that of the color filters 340. For example, the filtering layer 345 may be configured to block an infrared light. The filtering layer 345 may include a blue color filter but the inventive concept is not limited to this example.

A first penetration conductive pattern 511 may be provided in the light-blocking region OB to penetrate the semiconductor substrate 100 and may be electrically connected to a metal line 221 of the readout circuit layer L2 and an interconnection structure 1111 of the logic chip 2. The first penetration conductive pattern 511 may have a first bottom surface and a second bottom surface which are located at different levels. First gapfill pattern 521 may be provided in the first penetration conductive pattern 511. The first gapfill pattern 521 may be formed of or include at least one of low refractive materials and may have an insulating property.

In the pad region RR2, conductive pads PAD may be provided on the second surface 100b of the semiconductor substrate 100. The conductive pads PAD may be buried in the semiconductor substrate 100 near the second surface 100b. As an example, in the pad region RR2, the conductive pads PAD may be provided in a pad trench that is formed in the second surface 100b of the semiconductor substrate 100. The conductive pads PAD may be formed of or include at least one of metallic materials (e.g., aluminum, copper, tungsten, titanium, tantalum, or alloys thereof). In a process of mounting an image sensor, bonding wires may be bonded to the conductive pads PAD. The conductive pads PAD may be electrically connected to an external device through the bonding wires.

A second penetration conductive pattern 513 may be provided in the pad region RR2 to penetrate the semiconductor substrate 100 and may be electrically connected to the interconnection structure 1111 of the logic chip 2. The second penetration conductive pattern 513 may vertically extend from a region on the second surface 100b of the semiconductor substrate 100 and may be electrically connected to the conductive pads PAD. A portion of the second penetration conductive pattern 513 may be disposed on bottom and side surfaces of the conductive pads PAD. A second gapfill pattern 523 may be provided in the second penetration conductive pattern 513. The second gapfill pattern 523 may be formed of or include a low refractive material and may have an insulating property. In the pad region RR2, the pixel isolation structure PIS may be provided around the second penetration conductive pattern 513.

The logic chip 2 may include a logic semiconductor substrate 200, logic circuits TR, the interconnection structures 1111 connected to the logic circuits, and a logic interlayer insulating layers 1110. The uppermost layer of the logic interlayer insulating layers 1110 may be coupled to the readout circuit layer L2 of the sensor chip 1. The logic chip 2 may be electrically connected to the sensor chip 1 through the first penetration conductive pattern 511 and the second penetration conductive pattern 513.

Although an example in which the sensor and logic chips 1 and 2 are electrically connected to each other through the first and second penetration conductive patterns 511 and 513 has been described, the inventive concept is not limited to this example.

In the embodiment shown in FIG. 16, the first and second penetration conductive patterns of FIG. 15 may be omitted, and the sensor and logic chips 1 and 2 may be electrically connected to each other through a direct bonding between bonding pads BP1 and BP2. The bonding pad BP1 in the sensor chip 1 is provided in the uppermost layer of the sensor chip 1, and the bonding pad BP2 in the logic chip 2 is provided in the bottommost layer of the logic chip 2.

Specifically, the sensor chip 1 of the image sensor may include first bonding pads BP1, which are provided in the uppermost metal layer of the readout circuit layer L2, and the logic chip 2 may include second bonding pads BP2, which are provided in the bottommost metal layer in the interconnection structure 1111. The first and second bonding pads BP1 and BP2 may be formed of or include, for example, tungsten (W), aluminum (Al), copper (Cu), tungsten nitride (WN), tantalum nitride (TaN), or titanium nitride (TiN).

The first bonding pads BP1 of the sensor chip 1 and the second bonding pads BP2 of the logic chip 2 may be directly and electrically connected to each other in a hybrid bonding manner. Here, the hybrid bonding may mean a bonding manner, in which two elements containing the same kind of material are fused into a single element at an interface therebetween. For example, in the case where the first and second bonding pads BP1 and BP2 are formed of copper (Cu), they may be physically and electrically connected to each other in a Cu—Cu bonding manner. In addition, surfaces of insulating layers of the sensor and logic chips 1 and 2 may be bonded to each other in a dielectric-dielectric bonding manner.

According to an embodiment of the inventive concept, it may be possible to remove a kT/C noise, which may occur in a reset operation, and thereby reducing a SNR dip at a point of time when first and second conversion gain modes are changed from each other during producing an image signal. In addition, it may be possible to omit a memory or a capacitor, which is used to temporarily store a reset signal. Accordingly, it may be possible to increase efficiency of a readout operation in an intra-scene dual conversion gain (IDCG) mode.

Accordingly, an image sensor may be improved in optical and electric characteristics, and achieve higher integration density.

While example embodiments of the inventive concept have been particularly shown and described, it will be understood by one of ordinary skill in the art that variations in form and detail may be made therein without departing from the spirit and scope of the appended claims.

What is claimed is:

1. A method of operating an image sensor including a dual conversion gain transistor provided between and connected to a first charge detection node and a second charge detection node, and a reset transistor provided between and connected to the second charge detection node and a pixel power voltage, the method comprising:
    performing a first reset operation to reset the first charge detection node and the second charge detection node;
    turning off the dual conversion gain transistor and reading out a first reset signal from the first charge detection node;
    transferring an electric charge accumulated in a photoelectric conversion device, to the first charge detection node and reading out a first pixel signal from the first charge detection node;
    turning on the dual conversion gain transistor and reading out a second pixel signal from the first charge detection node;
    performing a second reset operation to reset the first charge detection node and the second charge detection node; and
    reading out a second reset signal from the first charge detection node.

2. The method of claim 1, further comprising:
    generating a first sampling signal based on the first pixel signal and the first reset signal, before the reading out of the second pixel signal; and
    generating a second sampling signal based on the second pixel signal and the second reset signal after the reading out of the second pixel signal.

3. The method of claim 1, wherein, in the reading out of the first reset signal and the first pixel signal, a unit pixel has a first conversion gain, and
    wherein in the reading out of the second pixel signal and the second reset signal, the unit pixel has a second conversion gain that is smaller than the first conversion gain.

4. The method of claim 1, wherein the reset transistor is configured to have a potential gradient increasing in a direction from a channel region of the reset transistor to the pixel power voltage.

5. The method of claim 1, wherein an electric potential in the first charge detection node after the second reset operation is smaller than an electric potential in the first charge detection node after the first reset operation.

6. An image sensor, comprising:
    a semiconductor substrate of a first conductivity type;
    a photoelectric conversion region provided in the semiconductor substrate and doped to have a second conductivity type;
    a first floating diffusion region provided to receive photocharges accumulated in the photoelectric conversion region;
    a transfer gate electrode disposed between and connected to the first floating diffusion region and the photoelectric conversion region;
    a dual conversion gain transistor disposed between and connected to the first floating diffusion region and a second floating diffusion region; and
    a reset transistor disposed between and connected to the second floating diffusion region and a pixel power voltage region,
    wherein a channel region of the reset transistor has a potential gradient increasing in a direction from the second floating diffusion region toward the pixel power voltage region.

7. The image sensor of claim 6, wherein a channel region of the dual conversion gain transistor has a potential gradient increasing in a direction from the first floating diffusion region toward the second floating diffusion region.

8. The image sensor of claim 6, wherein the reset transistor comprises:
    a reset gate electrode on the semiconductor substrate; and
    a first gate insulating layer between the reset gate electrode and the semiconductor substrate,
    wherein the first gate insulating layer comprises a first portion adjacent to the pixel power voltage region and a second portion adjacent to the second floating diffusion region, and
    wherein the first portion has a first thickness, and the second portion has a second thickness that is larger than the first thickness.

9. The image sensor of claim 6, wherein the reset transistor comprises:
    a reset gate electrode on the semiconductor substrate;
    a first gate insulating layer between the reset gate electrode and the semiconductor substrate; and
    a first channel impurity region provided below the reset gate electrode and the first gate insulating layer, and in the semiconductor substrate,
    wherein the first channel impurity region comprises a first region adjacent to the pixel power voltage region and a second region adjacent to the second floating diffusion region, and
    wherein an impurity concentration in the first region is higher than an impurity concentration in the second region.

10. The image sensor of claim 9, wherein the first region is doped to have the second conductivity type, and the second region is an undoped region.

11. The image sensor of claim 9, wherein the dual conversion gain transistor comprises:
    a dual conversion gain gate electrode on the semiconductor substrate;
    a second gate insulating layer between the dual conversion gain gate electrode and the semiconductor substrate; and
    a second channel impurity region provided below the dual conversion gain gate electrode and the second gate insulating layer, and in the semiconductor substrate,
    wherein an impurity concentration in the second channel impurity region is substantially equal to an impurity concentration in the second region of the first channel impurity region.

12. The image sensor of claim 6, wherein the reset transistor comprises:
a reset gate electrode on the semiconductor substrate;
a first gate insulating layer between the reset gate electrode and the semiconductor substrate; and
a first channel impurity region provided below the reset gate electrode and the first gate insulating layer, and in the semiconductor substrate,
wherein the first channel impurity region comprises a first region adjacent to the pixel power voltage region and a second region adjacent to the second floating diffusion region, and
wherein the first region is doped to have the second conductivity type, and the second region is doped to have the first conductivity type.

13. The image sensor of claim 6, further comprising:
a pixel isolation structure provided in the semiconductor substrate to form a first pixel region and a second pixel region;
a device isolation layer provided in the semiconductor substrate to form an active portion in each of the first pixel region and the second pixel region,
wherein the reset transistor is provided on the active portion of the first pixel region, and
wherein the dual conversion gain transistor is provided on the active portion of the second pixel region.

14. The image sensor of claim 13, wherein the reset transistor comprises a reset gate electrode intersecting the active portion of the first pixel region, a first source region at a side of the reset gate electrode, and a first drain region at an opposite side of the reset gate electrode,
wherein the dual conversion gain transistor comprises a dual conversion gain gate electrode intersecting the active portion of the second pixel region, a second source region at a side of the dual conversion gain gate electrode, and a second drain region at an opposite side of the dual conversion gain gate electrode,
wherein the pixel power voltage region is connected to the first source region,
wherein the second drain region is connected to the first floating diffusion region, and
wherein the first drain region and the second source region are connected in common to the second floating diffusion region.

15. The image sensor of claim 6, wherein the first floating diffusion region and the second floating diffusion region are reset by turning on the reset transistor, after a pixel signal is read out during turning on of the dual conversion gain transistor.

16. An image sensor, comprising:
a semiconductor substrate of a first conductivity type;
a photoelectric conversion region provided in the semiconductor substrate and doped to have a second conductivity type;
a first floating diffusion region provided in the semiconductor substrate and spaced apart from the photoelectric conversion region;
a transfer gate electrode provided between the photoelectric conversion region and the first floating diffusion region;
a dual conversion gain gate electrode provided between the first floating diffusion region and a second floating diffusion region;
a reset gate electrode provided between the second floating diffusion region and a pixel power voltage region;
a first gate insulating layer between the reset gate electrode and the semiconductor substrate; and
a second gate insulating layer between the dual conversion gain gate electrode and the semiconductor substrate,
wherein the first gate insulating layer comprises a first portion adjacent to the pixel power voltage region and a second portion adjacent to the second floating diffusion region,
wherein the first portion has a first thickness, and the second portion has a second thickness that is larger than the first thickness, and
wherein the second gate insulating layer has a third thickness that is substantially equal to the second thickness of the second portion of the first gate insulating layer.

17. The image sensor of claim 16, further comprising:
a pixel isolation structure disposed in the semiconductor substrate to form a first pixel region and a second pixel region; and
a device isolation layer disposed in the semiconductor substrate to form an active portion in each of the first pixel region and the second pixel region,
wherein the dual conversion gain gate electrode is disposed on the active portion of the first pixel region, and
wherein the reset gate electrode is disposed on the active portion of the second pixel region.

18. The image sensor of claim 17, wherein the pixel isolation structure is provided to enclose the photoelectric conversion region.

19. The image sensor of claim 17, further comprising:
a plurality of color filters corresponding to the first pixel region and the second pixel region, respectively; and
a plurality of micro lenses provided on the plurality of color filters, respectively,
wherein the semiconductor substrate has a first surface and a second surface that is opposite to the first surface,
wherein the reset gate electrode and the dual conversion gain gate electrode are disposed on the first surface, and
wherein the plurality of color filters and the plurality of micro lenses are disposed on the second surface.

20. The image sensor of claim 16, further comprising:
a pixel isolation structure provided in the semiconductor substrate to form a pixel region; and
a device isolation layer disposed in the semiconductor substrate to form an active portion in the pixel region,
wherein the reset gate electrode and the dual conversion gain gate electrode are disposed on the active portion and are spaced apart from each other,
wherein the second floating diffusion region is provided in the active portion between the reset gate electrode and the dual conversion gain gate electrode, and
wherein the pixel power voltage region and the first floating diffusion region are provided in the active portion and are spaced apart from the second floating diffusion region.

* * * * *